(12) United States Patent
Zhu et al.

(10) Patent No.: US 9,106,234 B2
(45) Date of Patent: Aug. 11, 2015

(54) PROGRAMMABLE FREQUENCY DIVIDER FOR LOCAL OSCILLATOR GENERATION

(71) Applicant: QUALCOMM Incorporated, San Diego, CA (US)

(72) Inventors: Yunliang Zhu, San Diego, CA (US); Yiwu Tang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 82 days.

(21) Appl. No.: 13/837,463

(22) Filed: Mar. 15, 2013

(65) Prior Publication Data

US 2014/0266471 A1   Sep. 18, 2014

(51) Int. Cl.
| | |
|---|---|
| H03B 19/14 | (2006.01) |
| H03B 27/00 | (2006.01) |
| H03K 3/03 | (2006.01) |
| H03L 7/18 | (2006.01) |
| H03L 7/24 | (2006.01) |

(Continued)

(52) U.S. Cl.
CPC ......... *H03L 7/00* (2013.01); *H03B 19/14* (2013.01); *H03B 27/00* (2013.01); *H03K 3/0315* (2013.01); *H03K 3/0322* (2013.01); *H03L 7/18* (2013.01); *H03L 7/24* (2013.01); *H04B 1/40* (2013.01)

(58) Field of Classification Search
CPC .......... H03B 19/14; H03B 27/00; H03B 1/40; H03B 1/403; H03D 3/004; H03K 3/0315; H03L 7/18; H03L 7/24
USPC ............ 331/45, 51, 57, 74; 455/196.1, 197.1, 455/208, 255–260, 264, 265, 318, 319
See application file for complete search history.

(56) References Cited

U.S. PATENT DOCUMENTS

| | | | | |
|---|---|---|---|---|
| 6,867,656 B2 * | 3/2005 | Hajimiri et al. | .................. | 331/45 |
| 7,383,033 B2 * | 6/2008 | Holger | ........................... | 455/264 |
| 7,522,008 B2 * | 4/2009 | Jang et al. | ...................... | 331/172 |
| 8,248,172 B2 * | 8/2012 | Okada et al. | .................... | 331/57 |

(Continued)

FOREIGN PATENT DOCUMENTS

WO   2012111131 A1   8/2012

OTHER PUBLICATIONS

Hara, et al., 10MHz to 7GHz Quadrature Signal Generation Using a Divide-by-4/3, -3/2, -5/3, -2, -5/2, -3, -4, and -5 Injection-Locked Frequency Divider, Symposium on VLSI Circuits/Technical Digest of Technical Papers, 2010, pp. 51-52.

(Continued)

*Primary Examiner* — Levi Gannon
(74) *Attorney, Agent, or Firm* — Arent Fox LLP

(57) ABSTRACT

A method, an apparatus, and a computer program product are provided. The apparatus generates LO signals. The apparatus includes a LO generator module and an injection signal generator module coupled together. The LO generator module has a plurality of LO outputs and a plurality of injection signal inputs. The LO module is configured to generate the LO signals on the LO outputs based on injection signals received on the injection signal inputs. The injection signal generator module has a plurality of LO inputs and a plurality of injection signal outputs. The LO inputs are coupled to the LO outputs. The injection signal outputs are coupled to the injection signal inputs. The injection signal generator module is configured to generate injection signals on the injection signal outputs based on the LO signals received on the LO inputs and based on a received VCO signal.

81 Claims, 13 Drawing Sheets

(51) Int. Cl.
  *H04B 1/40* (2006.01)
  *H03L 7/00* (2006.01)

(56) References Cited

U.S. PATENT DOCUMENTS

| | | | |
|---|---|---|---|
| 8,339,208 | B2 * | 12/2012 | Luong et al. ............ 331/117 FE |
| 8,456,246 | B2 * | 6/2013 | Lee et al. ........................ 331/50 |
| 2005/0143028 | A1 | 6/2005 | Zheng et al. |
| 2007/0159259 | A1 | 7/2007 | Suh et al. |
| 2011/0003571 | A1 | 1/2011 | Park et al. |
| 2011/0076944 | A1 | 3/2011 | Mihota |
| 2012/0038396 | A1 | 2/2012 | Shima et al. |
| 2012/0268177 | A1 | 10/2012 | Hogeboom et al. |
| 2013/0002318 | A1 | 1/2013 | Lu et al. |

OTHER PUBLICATIONS

Lee, et al., "A 470-••W 5-GHz Digitally Controlled Injection-Locked Multi-Modulus Frequency Divider With an In-Phase Dual-Input Injection Scheme", IEEE Transactions on Very Large Scale Integration (VLSI) Systems, vol. 19, No. 1, Jan. 2011, pp. 61-70.

Toso, et al., "A 0.06mm2 11mW Local Oscillator for the GSM standard in 65nm CMOS", IEEE Journal of Solid-State Circuits, vol. 45, No. 7, Jul. 2010, pp. 1295-1304.

International Search Report and Written Opinion—PCT/US2014/023792—ISA/EPO—Aug. 18, 2014.

Partial International Search Report—PCT/US2014/023792—ISA/EPO-Jun. 10, 2014.

* cited by examiner

- Divide-by-3 : 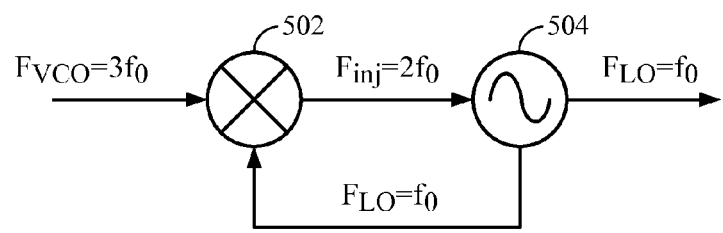
- Divide-by-4 : 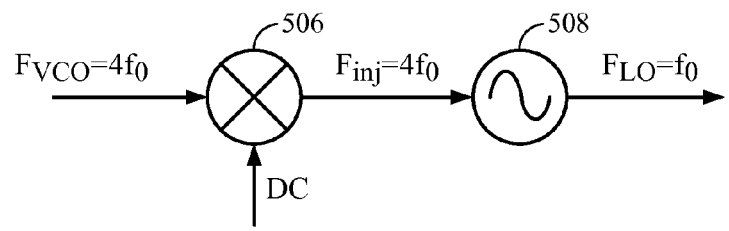
- Divide-by-5 : 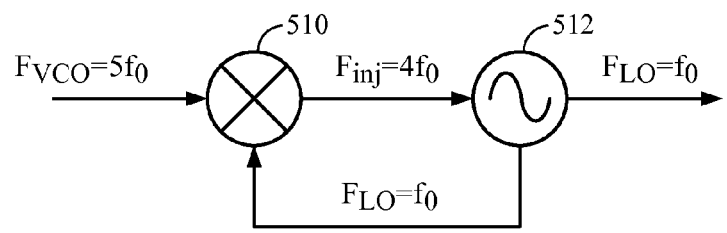
FIG. 5

| Division ratio | VCO signal | LO signal | Injection signal | Injection signal phase sequence |
|---|---|---|---|---|
| 3 | $3f_0$ | $f_0$ | $2f_0$ | $(\alpha, \alpha, \alpha+\pi, \alpha+\pi)$ |
| 4 | $4f_0$ | $f_0$ | $4f_0$ | $(\alpha, \alpha+\pi, \alpha, \alpha+\pi)$ |
| 5 | $5f_0$ | $f_0$ | $4f_0$ | $(\alpha, \alpha+\pi, \alpha, \alpha+\pi)$ |

PROGRAMMABLE FREQUENCY DIVIDER FOR LOCAL OSCILLATOR GENERATION

BACKGROUND

1. Field

The present disclosure relates generally to communication systems, and more particularly, to a programmable frequency divider for local oscillator generation.

2. Background

A wireless device (e.g., a cellular phone or a smartphone) may transmit and receive data for two-way communication with a wireless communication system. The wireless device may include a transmitter for data transmission and a receiver for data reception. For data transmission, the transmitter may modulate a transmit local oscillator (LO) signal with data to obtain a modulated radio frequency (RF) signal, amplify the modulated RF signal to obtain an output RF signal having the desired output power level, and transmit the output RF signal via an antenna to a base station. For data reception, the receiver may obtain a received RF signal via the antenna, amplify and downconvert the received RF signal with a receive LO signal, and process the downconverted signal to recover data sent by the base station.

The wireless device may include one or more oscillators to generate one or more oscillator signals at one or more desired frequencies. The oscillator signal(s) may be used to generate the transmit LO signal for the transmitter and the receive LO signal for the receiver. The oscillator(s) may be required to generate the oscillator signal(s) to meet the requirements of the wireless communication system with which the wireless device communicates.

Frequency dividers are used extensively for generating LO signals. Typically, frequency dividers only provide a fixed division ratio. Accordingly, multiple frequency dividers are typically needed in multi-band transceivers. Existing programmable frequency dividers do not meet the stringent LO requirements (e.g., small chip area, good phase noise requirement, quadrature output) in cellular transceivers. Accordingly, there is a need for a programmable frequency divider for generating LO signals in multi-band cellular transceivers.

SUMMARY

In an aspect of the disclosure, a method and an apparatus are provided. The apparatus generates LO signals. The apparatus includes a LO generator module and an injection signal generator module. The LO generator module has a plurality of LO outputs and a plurality of injection signal inputs. The LO module is configured to generate the LO signals on the LO outputs based on injection signals received on the injection signal inputs. The injection signal generator module is coupled to the LO generator module. The injection signal generator module has a plurality of LO inputs and a plurality of injection signal outputs. The LO inputs are coupled to the LO outputs. The injection signal outputs are coupled to the injection signal inputs. The injection signal generator module is configured to generate injection signals on the injection signal outputs based on the LO signals received on the LO inputs and based on a received voltage controlled oscillator (VCO) signal.

In an aspect of the disclosure, a method and an apparatus are provided. The apparatus generates LO signals. The apparatus generates, in a LO generator module, the LO signals based on received injection signals. In addition, the apparatus generates, in an injection signal generator module, the injection signals based on the LO signals and a received VCO signal.

BRIEF DESCRIPTION OF THE DRAWINGS

FIG. 5 is a diagram illustrating methods for generating divide by three, four, and five division ratios.

FIG. 6 is a table indicating the injection signal phase sequence for each of the divide by three, four, and five division ratios.

DETAILED DESCRIPTION

Figure 1:
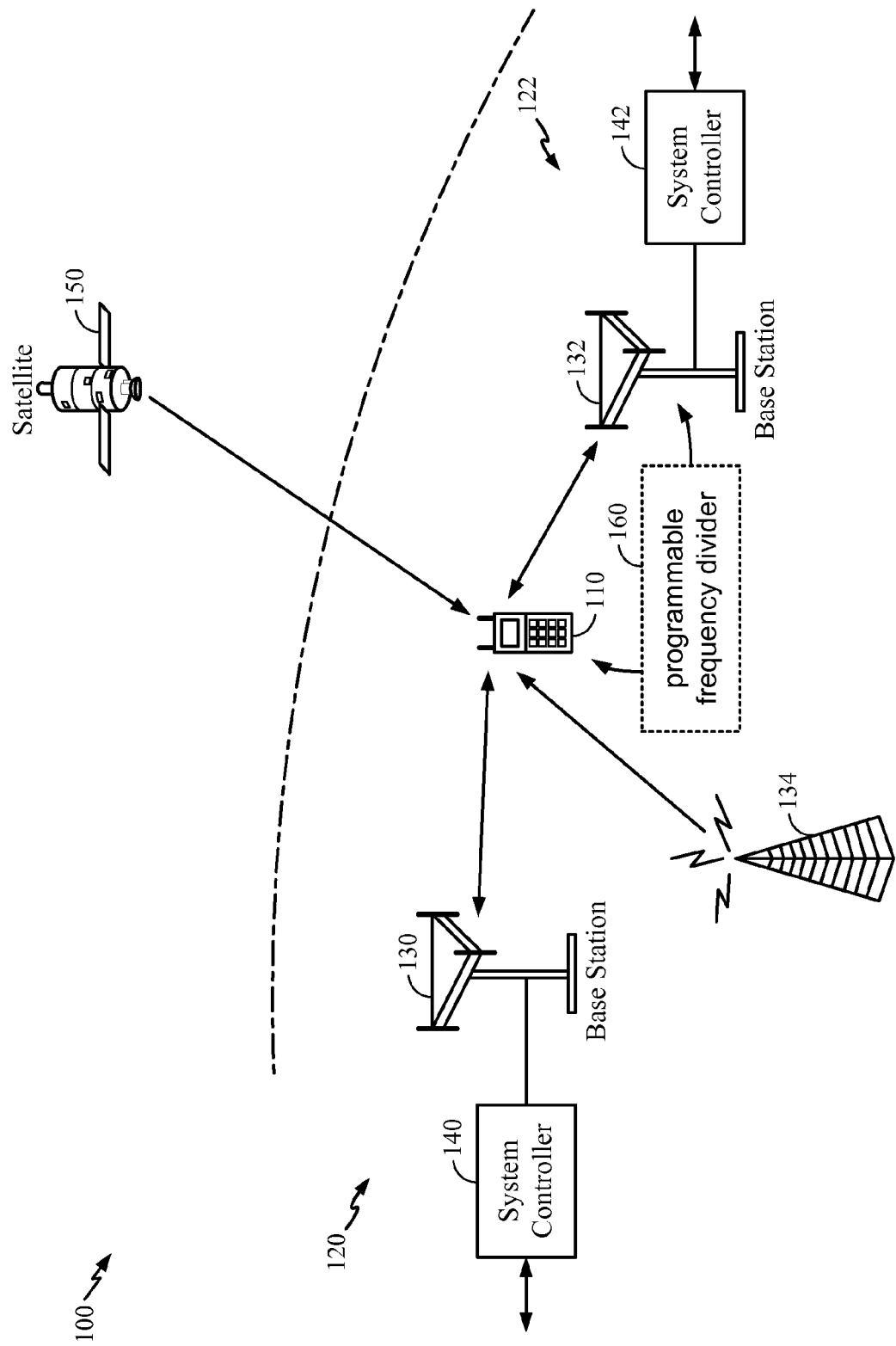
FIG. 1 illustrates a wireless device communicating with different wireless communication systems.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. The term "exemplary" is used herein to mean "serving as an example, instance, or illustration." Any design described herein as "exemplary" is not necessarily to be construed as preferred or advantageous over other designs.

Several aspects of telecommunication systems will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, firmware, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise random-access memory (RAM), read-only memory (ROM), electronically erasable programmable ROM (EEPROM), compact disk (CD) ROM (CD-ROM), or other optical disk storage, magnetic disk storage or other magnetic storage devices, or any other medium that can be used to carry or store desired program code in the form of instructions or data structures and that can be accessed by a computer. Disk and disc, as used herein, includes CD, laser disc, optical disc, digital versatile disc (DVD), and floppy disk where disks usually reproduce data magnetically, while discs reproduce data optically with lasers. Combinations of the above should also be included within the scope of computer-readable media.

FIG. 1 is a diagram 100 illustrating a wireless device 110 communicating with different wireless communication systems 120, 122. The wireless systems 120, 122 may each be a Code Division Multiple Access (CDMA) system, a Global System for Mobile Communications (GSM) system, a Long Term Evolution (LTE) system, a wireless local area network (WLAN) system, or some other wireless system. A CDMA system may implement Wideband CDMA (WCDMA), CDMA 1X or cdma2000, Time Division Synchronous Code Division Multiple Access (TD-SCDMA), or some other version of CDMA. TD-SCDMA is also referred to as Universal Terrestrial Radio Access (UTRA) Time Division Duplex (TDD) 1.28 Mcps Option or Low Chip Rate (LCR). LTE supports both frequency division duplexing (FDD) and time division duplexing (TDD). For example, the wireless system 120 may be a GSM system, and the wireless system 122 may be a WCDMA system. As another example, the wireless system 120 may be an LTE system, and the wireless system 122 may be a CDMA system.

For simplicity, the diagram 100 shows the wireless system 120 including one base station 130 and one system controller 140, and the wireless system 122 including one base station 132 and one system controller 142. In general, each wireless system may include any number of base stations and any set of network entities. Each base station may support communication for wireless devices within the coverage of the base station. The base stations may also be referred to as a Node B, an evolved Node B (eNB), an access point, a base transceiver station, a radio base station, a radio transceiver, a transceiver function, a basic service set (BSS), an extended service set (ESS), or some other suitable terminology. The wireless device 110 may also be referred to as a user equipment (UE), a mobile device, a remote device, a wireless device, a wireless communications device, a station, a mobile station, a subscriber station, a mobile subscriber station, a terminal, a mobile terminal, a remote terminal, a wireless terminal, an access terminal, a client, a mobile client, a mobile unit, a subscriber unit, a wireless unit, a remote unit, a handset, a user agent, or some other suitable terminology. The wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, or some other similar functioning device.

The wireless device 110 may be capable of communicating with the wireless system 120 and/or 122. The wireless device 110 may also be capable of receiving signals from broadcast stations, such as the broadcast station 134. The wireless device 110 may also be capable of receiving signals from satellites, such as the satellite 150, in one or more global navigation satellite systems (GNSS). The wireless device 110 may support one or more radio technologies for wireless communication such as GSM, WCDMA, cdma2000, LTE, 802.11, etc. The terms "radio technology," "radio access technology," "air interface," and "standard" may be used interchangeably.

The wireless device 110 may communicate with a base station in a wireless system via the downlink and the uplink. The downlink (or forward link) refers to the communication link from the base station to the wireless device, and the uplink (or reverse link) refers to the communication link from the wireless device to the base station. A wireless system may utilize TDD and/or FDD. For TDD, the downlink and the uplink share the same frequency, and downlink transmissions and uplink transmissions may be sent on the same frequency in different time periods. For FDD, the downlink and the uplink are allocated separate frequencies. Downlink transmissions may be sent on one frequency, and uplink transmissions may be sent on another frequency. Some exemplary radio technologies supporting TDD include GSM, LTE, and TD-SCDMA. Some exemplary radio technologies supporting FDD include WCDMA, cdma2000, and LTE. The wireless device 110 and/or the base stations 130, 132 may include an exemplary programmable frequency divider 160. An exemplary programmable frequency divider 160 is provided infra.

Figure 2:
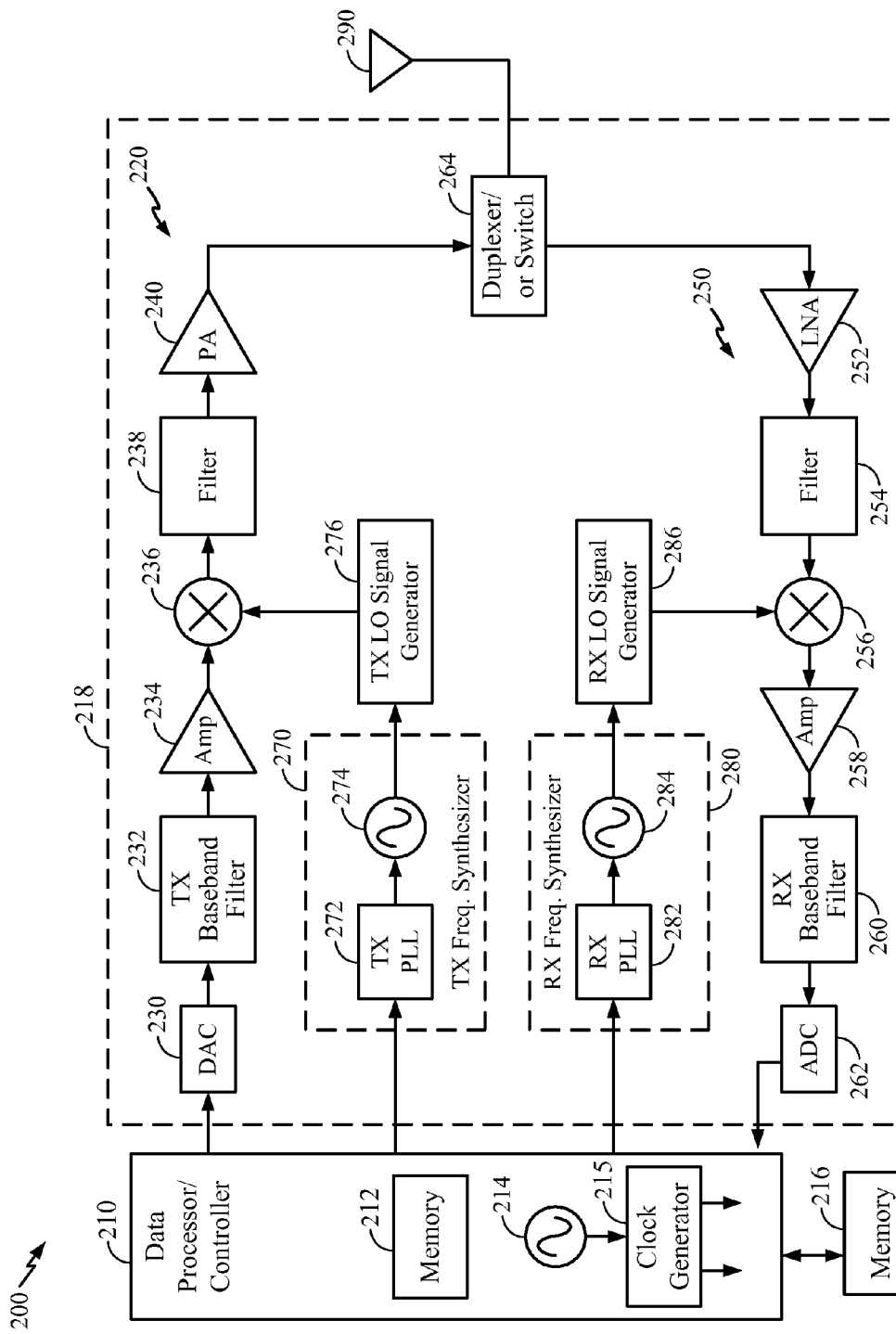
FIG. 2 is a block diagram of a wireless device.

FIG. 2 is a block diagram 200 of an exemplary wireless device, such as the wireless device 110. The wireless device includes a data processor/controller 210, a transceiver 218, and an antenna 290. The data processor/controller 210 may be referred to as a processing system. A processing system may include the data processor/controller 210 or both the data processor/controller 210 and the memory 216. The transceiver 218 includes a transmitter 220 and a receiver 250 that support bi-directional communication. The transmitter 220 and/or the receiver 250 may be implemented with a super-heterodyne architecture or a direct-conversion architecture. In the super-heterodyne architecture, a signal is frequency converted between RF and baseband in multiple stages, e.g., from RF to an intermediate frequency (IF) in one stage, and then from IF to baseband in another stage for a receiver. In the direct-conversion architecture, which is also referred to as a zero-IF architecture, a signal is frequency converted between RF and baseband in one stage. The super-heterodyne and direct-conversion architectures may use different circuit blocks and/or have different requirements. In the exemplary design shown in FIG. 2, the transmitter 220 and the receiver 250 are implemented with the direct-conversion architecture.

In the transmit path, the data processor/controller 210 may process (e.g., encode and modulate) data to be transmitted and provide the data to a digital-to-analog converter (DAC) 230. The DAC 230 converts a digital input signal to an analog output signal. The analog output signal is provided to a transmit (TX) baseband (lowpass) filter 232, which may filter the analog output signal to remove images caused by the prior digital-to-analog conversion by the DAC 230. An amplifier (amp) 234 may amplify the signal from the TX baseband filter 232 and provide an amplified baseband signal. An upconverter (mixer) 236 may receive the amplified baseband signal and a TX LO signal from a TX LO signal generator 276. The upconverter 236 may upconvert the amplified baseband signal with the TX LO signal and provide an upconverted signal. A filter 238 may filter the upconverted signal to remove images caused by the frequency upconversion. A power amplifier (PA) 240 may amplify the filtered RF signal from the filter 238 to obtain the desired output power level and provide an output RF signal. The output RF signal may be routed through a duplexer/switchplexer 264.

For FDD, the transmitter 220 and the receiver 250 may be coupled to the duplexer 264, which may include a TX filter for the transmitter 220 and a receive (RX) filter for the receiver 250. The TX filter may filter the output RF signal to pass signal components in a transmit band and attenuate signal components in a receive band. For TDD, the transmitter 220 and the receiver 250 may be coupled to switchplexer 264. The switchplexer 264 may pass the output RF signal from the transmitter 220 to the antenna 290 during uplink time intervals. For both FDD and TDD, the duplexer/switchplexer 264 may provide the output RF signal to the antenna 290 for transmission via a wireless channel.

In the receive path, the antenna 290 may receive signals transmitted by base stations and/or other transmitter stations and may provide a received RF signal. The received RF signal may be routed through duplexer/switchplexer 264. For FDD, the RX filter within the duplexer 264 may filter the received RF signal to pass signal components in a receive band and attenuate signal components in the transmit band. For TDD, the switchplexer 264 may pass the received RF signal from the antenna 290 to the receiver 250 during downlink time intervals. For both FDD and TDD, the duplexer/switchplexer 264 may provide the received RF signal to the receiver 250.

Within the receiver 250, the received RF signal may be amplified by a low noise amplifier (LNA) 252 and filtered by a filter 254 to obtain an input RF signal. A downconverter (mixer) 256 may receive the input RF signal and an RX LO signal from an RX LO signal generator 286. The downconverter 256 may downconvert the input RF signal with the RX LO signal and provide a downconverted signal. The downconverted signal may be amplified by an amplifier 258 and further filtered by an RX baseband (lowpass) filter 260 to obtain an analog input signal. The analog input signal is provided to an analog-to-digital converter (ADC) 262. The ADC 262 converts an analog input signal to a digital output signal. The digital output signal is provided to the data processor/controller 210.

A TX frequency synthesizer 270 may include a TX phase locked loop (PLL) 272 and a VCO 274. The VCO 274 may generate a TX VCO signal at a desired frequency. The TX PLL 272 may receive timing information from the data processor/controller 210 and generate a control signal for the VCO 274. The control signal may adjust the frequency and/or the phase of the VCO 274 to obtain the desired frequency for the TX VCO signal. The TX frequency synthesizer 270 provides the TX VCO signal to the TX LO signal generator 276. The TX LO signal generator may generate a TX LO signal based on the TX VCO signal received from the TX frequency synthesizer 270.

A RX frequency synthesizer 280 may include an RX PLL 282 and a VCO 284. The VCO 284 may generate an RX VCO signal at a desired frequency. The RX PLL 282 may receive timing information from the data processor/controller 210 and generate a control signal for the VCO 284. The control signal may adjust the frequency and/or the phase of the VCO 284 to obtain the desired frequency for the RX VCO signal. The RX frequency synthesizer 280 provides the RX VCO signal to the RX LO signal generator 286. The RX LO signal generator may generate an RX LO signal based on the RX VCO signal received from the RX frequency synthesizer 280.

The LO signal generators 276, 286 may each include frequency dividers, buffers, etc. The LO signal generators 276, 286 may be referred to as frequency dividers if they divide a frequency provided by the TX frequency synthesizer 270 and the RX frequency synthesizer 280, respectively. The PLLs 272, 282 may each include a phase/frequency detector, a loop filter, a charge pump, a frequency divider, etc. Each VCO signal and each LO signal may be a periodic signal with a particular fundamental frequency. The TX LO signal and the RX LO signal from the LO generators 276, 286 may have the same frequency for TDD or different frequencies for FDD. The TX VCO signal and the RX VCO signal from the VCOs 274, 284 may have the same frequency (e.g., for TDD) or different frequencies (e.g., for FDD or TDD).

The conditioning of the signals in the transmitter 220 and the receiver 250 may be performed by one or more stages of amplifier, filter, upconverter, downconverter, etc. These circuits may be arranged differently from the configuration shown in FIG. 2. Furthermore, other circuits not shown in FIG. 2 may also be used to condition the signals in the transmitter 220 and the receiver 250. For example, impedance matching circuits may be located at the output of the PA 240, at the input of the LNA 252, between the antenna 290 and the duplexer/switchplexer 264, etc. Some circuits in FIG. 2 may also be omitted. For example, the filter 238 and/or the filter 254 may be omitted. All or a portion of the transceiver 218 may be implemented on one or more analog integrated circuits (ICs), RF ICs (RFICs), mixed-signal ICs, etc. For example, the TX baseband filter 232 to the PA 240 in the transmitter 220, the LNA 252 to the RX baseband filter 260 in the receiver 250, the PLLs 272, 282, the VCOs 274, 284, and the LO signal generators 276, 286 may be implemented on an RFIC. The PA 240 and possibly other circuits may also be implemented on a separate IC or a circuit module.

The data processor/controller 210 may perform various functions for the wireless device. For example, the data processor/controller 210 may perform processing for data being transmitted via the transmitter 220 and received via the receiver 250. The data processor/controller 210 may control the operation of various circuits within the transmitter 220 and the receiver 250. The memory 212 and/or the memory 216 may store program codes and data for the data processor/controller 210. The memory may be internal to the data processor/controller 210 (e.g., the memory 212) or external to the data processor/controller 210 (e.g., the memory 216). The memory may be referred to as a computer-readable medium. An oscillator 214 may generate a VCO signal at a particular frequency. A clock generator 215 may receive the VCO signal from the oscillator 214 and may generate clock signals for various modules within the data processor/controller 210.

The data processor/controller 210 may be implemented on one or more application specific integrated circuits (ASICs) and/or other ICs.

Frequency dividers, such as the frequency dividers 276, 286, are used extensively for generating LO signals. There is a need for a programmable frequency divider for generating LO signals in multi-band cellular transceivers that meets stringent LO requirements such as small chip area, good phase noise requirement, and quadrature output.

Figure 3:
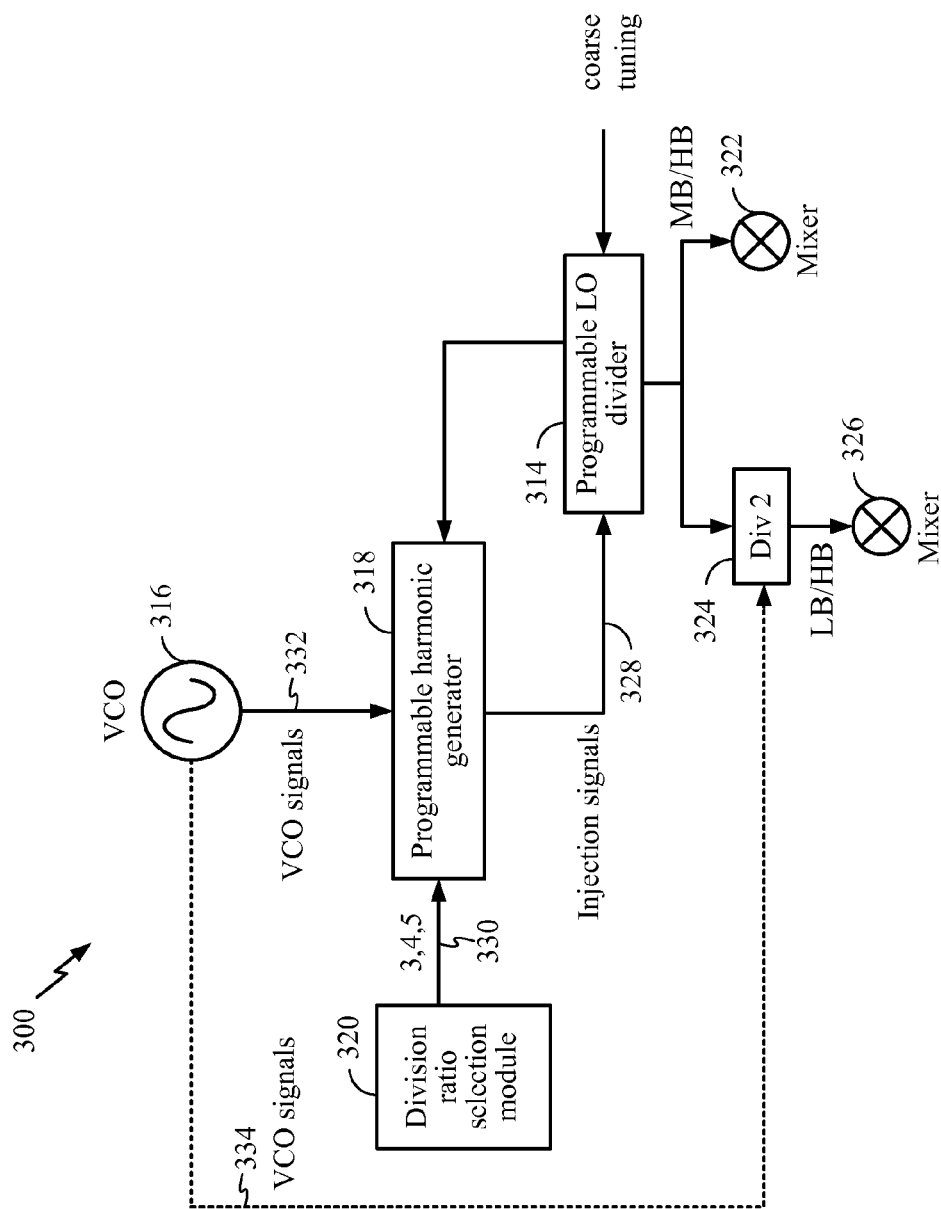
FIG. 3 is a block diagram illustrating LO signal generation using an exemplary programmable harmonic generator and an exemplary programmable LO divider.

FIG. 3 is a block diagram 300 illustrating LO signal generation using an exemplary programmable harmonic generator 318 and an exemplary programmable LO divider 314. As shown in FIG. 3, a VCO 316 provides VCO signals 332 to a programmable harmonic generator 318. The VCO 316 may correspond to the VCO 274 and/or the VCO 284. The programmable harmonic generator 318 receives a division ratio selection of 3, 4, or 5 from a division ratio selection module 320. The programmable harmonic generator 318 generates injection signals 328 based on the VCO signals 332 and the division ratio selection, and provides the injection signals 328 to a programmable LO divider 314. The programmable harmonic generator 318 and the programmable LO divider 314 may correspond to the TX LO signal generator 276 and/or the RX LO signal generator 286. Based on the injection signals 328, the programmable LO divider 314 generates LO signals corresponding to the selected division ratio. The programmable LO divider 314 is coarsely tuned to the desired target LO signal frequency. The output of the programmable LO divider 314 is coupled to a mixer 322 for mid-band (MB) LO signal generation and high-band (HB) LO signal generation. The output of the programmable LO divider 314 is also coupled to a divide-by-two frequency divider 324 for providing an additional divide-by-two division ratio for low-band (LB) LO signal generation. The VCO 316 may provide VCO signals 334 directly to the divide-by-two frequency divider 324 for providing a divide-by-two division ratio for HB LO signal generation. The divide-by-two frequency divider 324 is coupled to the mixer 326.

The apparatus of diagram 300 provides divide by two, three, four, five, six, eight, and ten division ratios. The available division ratios may allow for a lower VCO tuning range percentage, and therefore may allow the VCO 316 (also each of the VCOs 276, 286) to be implemented with only one VCO. For example, with the available division ratios, LO signals may be generated at requisite carrier frequencies based on a VCO signal between 6.8 GHz and 8.68 GHz. The VCO tuning range percentage for a VCO tuning range of 6.8 GHz to 8.68 GHz is 24.29% (i.e., (8.68 GHz−6.8 GHz)/((8.68 GHz+6.8 GHz)/2)). A VCO tuning range of 24.29% may be easily implemented with one VCO only. As such, the apparatus of the diagram 300 may allow the VCO 316 to be implemented with only one VCO.

The programmable harmonic generator 318 and programmable LO divider 314, discussed further infra, significantly reduces VCO tuning range requirements. Accordingly, utilized die area is reduced because multiple VCOs may not be needed for the VCO 316. Furthermore, the programmable harmonic generator 318 and programmable LO divider 314 reduce VCO phase noise and current consumption. Having one VCO for the VCO 316 also decreases efforts required for routing. An injection locked ring oscillator is proposed for the programmable LO divider 314. The injection-locked ring oscillator does not require an on-chip inductor and requires a small chip area. Further, the injection-locked ring oscillator has a large locking range due to a low quality factor (Q) of the ring oscillator.

Figure 4:
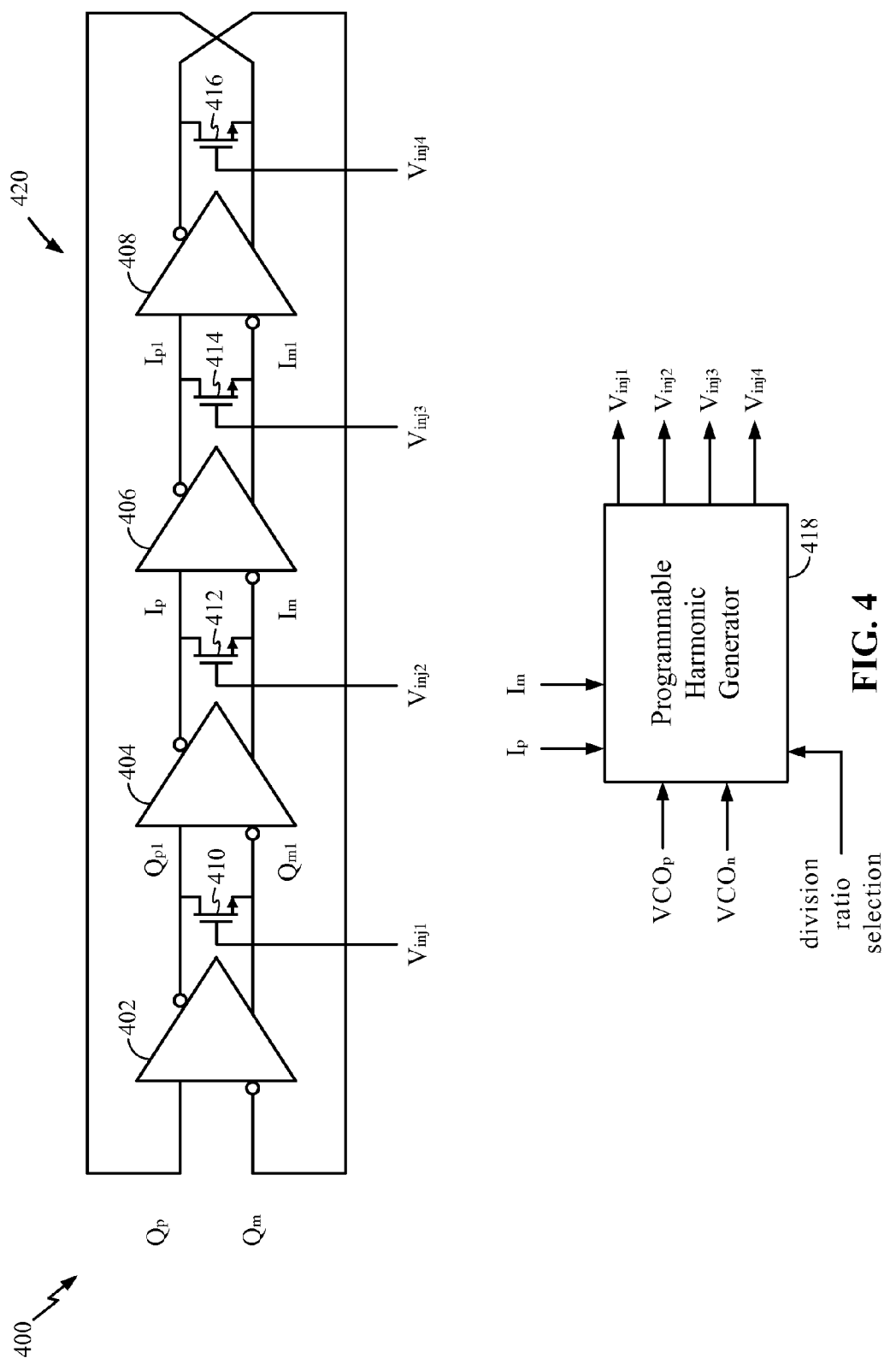
FIG. 4 is a schematic circuit diagram of a programmable harmonic generator and a programmable LO divider.

FIG. 4 is a schematic circuit diagram 400 of a programmable harmonic generator 418 and a programmable LO divider 420. The programmable LO divider 420 corresponds to the programmable LO divider 314. The programmable LO divider 420 may be referred to as a local oscillator generator module. The programmable LO divider 420 includes a ring oscillator. The ring oscillator includes a first ring oscillator delay stage 402 with an input coupled to an output $Q_p$, an inverted input coupled to an output $Q_m$, an inverted output $Q_{p1}$, and an output $Q_{m1}$. A switch 410 is coupled between the outputs $Q_{p1}$, $Q_{m1}$. The switch may be an NMOS transistor, with a drain coupled to the output $Q_{p1}$, a source coupled to the output $Q_{m1}$, and a gate coupled to a first injection signal $V_{inj1}$. A second ring oscillator delay stage 404 has an input coupled to the output $Q_{p1}$, an inverted input coupled to the output $Q_{m1}$, an inverted output $I_p$, and an output $I_m$. A switch 412 is coupled between the outputs $I_p$, $I_m$. The switch may be an n-channel metal-oxide-semiconductor (MOS) (NMOS) field-effect transistor (FET) transistor, with a drain coupled to the output $I_p$, a source coupled to the output $I_m$, and a gate coupled to a second injection signal $V_{inj2}$. A third ring oscillator delay stage 406 has an input coupled to the output $I_p$, an inverted input coupled to the output $I_m$, an inverted output $I_{p1}$, and an output $I_{m1}$. A switch 414 is coupled between the outputs $I_{p1}$, $I_{m1}$. The switch may be an NMOS transistor, with a drain coupled to the output $I_{p1}$, a source coupled to the output $I_{m1}$, and a gate coupled to a third injection signal $I_{inj3}$. A fourth ring oscillator delay stage 416 has an input coupled to the output $I_{p1}$, an inverted input coupled to the output $I_{m1}$, an inverted output $Q_m$, and an output $Q_p$. A switch 416 is coupled between the outputs $Q_m$, $Q_p$. The switch may be an NMOS transistor, with a drain coupled to the output $Q_m$, a source coupled to the output $Q_p$, and a gate coupled to a fourth injection signal $V_{inj4}$.

The switches 410, 412, 416, 418 provide direct injection to the differential outputs $Q_{p1}$ and $Q_{m1}$, $I_p$ and $I_m$, $I_{p1}$ and $I_{m1}$, and $Q_p$ and $Q_m$ to force the differential outputs to be the same periodically in order to provide the requisite synchronization for injection locking the ring oscillator. The switches 410, 412, 416, 418 may alternatively be a BJT or any type of FET (e.g., p-channel MOS (PMOS) transistor). The ring oscillator includes an even number of stages for providing quadrature LO output signals with 90° phase shifts. Each of the LO signal outputs $Q_p$ and $I_p$, $Q_{p1}$ and $I_{p1}$, $Q_m$ and $I_m$, and $Q_{m1}$ and $I_{m1}$ have a 90° phase shift difference. Each of the LO signal differential outputs $Q_{p1}$ and $Q_{m1}$, $I_p$ and $I_m$, $I_{p1}$ and $I_{m1}$, and $Q_p$ and $Q_m$ have a 180° phase shift difference. Each of the LO signal outputs $Q_p$ and $Q_{p1}$, $Q_{p1}$ and $I_p$, $I_p$ and $I_{p1}$, $I_{p1}$ and $Q_p$, $Q_m$ and $Q_{m1}$, $Q_{m1}$ and $I_m$, $I_m$ and $I_{m1}$, and $I_{m1}$ and $Q_m$ have a 45° phase shift difference. LO signal outputs may be taken from any of the LO signal outputs $I_p$, $I_m$, $Q_p$, $Q_m$, $I_{p1}$, $I_{m1}$, $Q_{p1}$, $Q_{m1}$.

The programmable harmonic generator 418 corresponds to the programmable harmonic generator 318. The programmable harmonic generator 418 may be referred to as an injection signal generator module. The programmable harmonic generator module 418 receives differential inputs $VCO_p$, $VCO_n$ from a VCO, differential inputs $I_p$ and $I_m$ from the programmable LO divider 420, and a division ratio selection input. Based on the received inputs, the programmable LO divider 420 outputs the injection signals $V_{inj1}$, $V_{inj2}$, $V_{inj3}$, $V_{inj4}$. The inputs $I_p$, $I_m$ are LO signal outputs from the programmable LO divider 420. While the programmable harmonic generator 418 is shown with inputs $I_p$, $I_m$, the programmable harmonic generator 418 may alternatively receive the inputs $I_{p1}$, $I_{m1}$, or $Q_{p1}$, $Q_{m1}$, or $Q_p$, $Q_m$. The programmable harmonic generator module 418 receives a division ratio selection, and based on the division ratio selection, generates the injection signals $V_{inj1}$, $V_{inj2}$, $V_{inj3}$, $V_{inj4}$ based on the received VCO signals $VCO_p$, $VCO_n$ and the received LO signals $I_p$, $I_m$.

FIG. 5 is a diagram 500 illustrating methods for generating divide by three, four, and five division ratios. For divide-by-three, a mixer 502 receives a VCO signal at the frequency $F_{VCO}$ equal to $3f_0$ and an LO signal from an LO signal generator 504. The LO signal is at the frequency $F_{LO}$ equal to $f_0$. The mixer 502 provides an injection signal at a frequency of $F_{inj}$ equal to $2f_0$. The LO signal generator 504 receives the injection signal at the frequency of $2f_0$ and provides the LO signal at the frequency $F_{LO}$ equal to $f_0$. The LO signal is fed back to the mixer 502. Accordingly, divide-by-three is obtained, as $F_{VCO}/F_{LO} = 3f_0/f_0 = 3$.

For divide-by-four, a mixer 506 receives a VCO signal at the frequency $F_{VCO}$ equal to $3f_0$ and a direct current (DC) input. The mixer 506 provides an injection signal at a frequency of $F_{inj}$ equal to $4f_0$. An LO signal generator 508 receives the injection signal at the frequency of $4f_0$ and provides an LO signal at the frequency $F_{LO}$ equal to $f_0$. Accordingly, divide-by-four is obtained, as $F_{VCO}/F_{LO} = 4f_0/f_0 = 4$.

For divide-by-five, a mixer 510 receives a VCO signal at the frequency $F_{vco}$ equal to $5f_0$ and an LO signal from an LO signal generator 512. The LO signal is at the frequency $F_{LO}$ equal to $f_0$. The mixer 510 provides an injection signal at a frequency of $F_{inj}$ equal to $4f_0$. The LO signal generator 512 receives the injection signal at the frequency of $4f_0$ and provides the LO signal at the frequency $F_{LO}$ equal to $f_0$. The LO signal is fed back to the mixer 510. Accordingly, divide-by-five is obtained, as $F_{VCO}/F_{LO} = 5f_0/f_0 = 5$.

FIG. 6 is a table 600 indicating the injection signal phase sequence for each of the divide by three, four, and five division ratios. For a division ratio of three, the VCO signal has a frequency of $3f_0$ and the LO signal has a frequency of $f_0$. As discussed in relation to FIG. 5, the injection signal output from the programmable harmonic generator 318, 418 and input to the programmable LO divider 314, 420 has a frequency of $2f_0$. The division ratio of three is obtained in the programmable LO divider 314, 420 in part by setting a phase of the injection signals $V_{inj1}$, $V_{inj2}$, $V_{inj3}$, and $V_{inj4}$ to α, α, α+π, and α+π, respectively. If α=0, then the injection signal phase sequence is 0, π, 0, π for the injection signals $V_{inj1}$, $V_{inj2}$, $V_{inj3}$, $V_{inj4}$. For a division ratio of four, the VCO signal has a frequency of $4f_0$ and the LO signal has a frequency of $f_0$. As discussed in relation to FIG. 5, the injection signal output from the programmable harmonic generator 318, 418 and input to the programmable LO divider 314, 420 has a frequency of $4f_0$. The division ratio of four is obtained in the programmable LO divider 314, 420 in part by setting a phase of the injection signals $V_{inj1}$, $V_{inj2}$, $V_{inj3}$, and $V_{inj4}$ to α, α+π, α, and α+π, respectively. If α=0, then the injection signal phase sequence is 0, π, 0, π for the injection signals $V_{inj1}$, $V_{inj2}$, $V_{inj3}$, $V_{inj4}$. For a division ratio of five, the VCO signal has a frequency of $5f_0$ and the LO signal has a frequency of $f_0$. As discussed in relation to FIG. 5, the injection signal output from the programmable harmonic generator 318, 418 and input to the programmable LO divider 314, 420 has a frequency of $4f_0$. The division ratio of five is obtained in the programmable LO divider 314, 420 in part by setting a phase of the injection signals $V_{inj1}$, $V_{inj2}$, $V_{inj3}$ and $V_{inj4}$ to α, α+π, α, and α+π, respectively. If α=0, then the injection signal phase sequence is 0, π, 0, π for the injection signals $V_{inj1}$, $V_{inj2}$, $V_{inj3}$, $V_{inj4}$.

Figure 7:
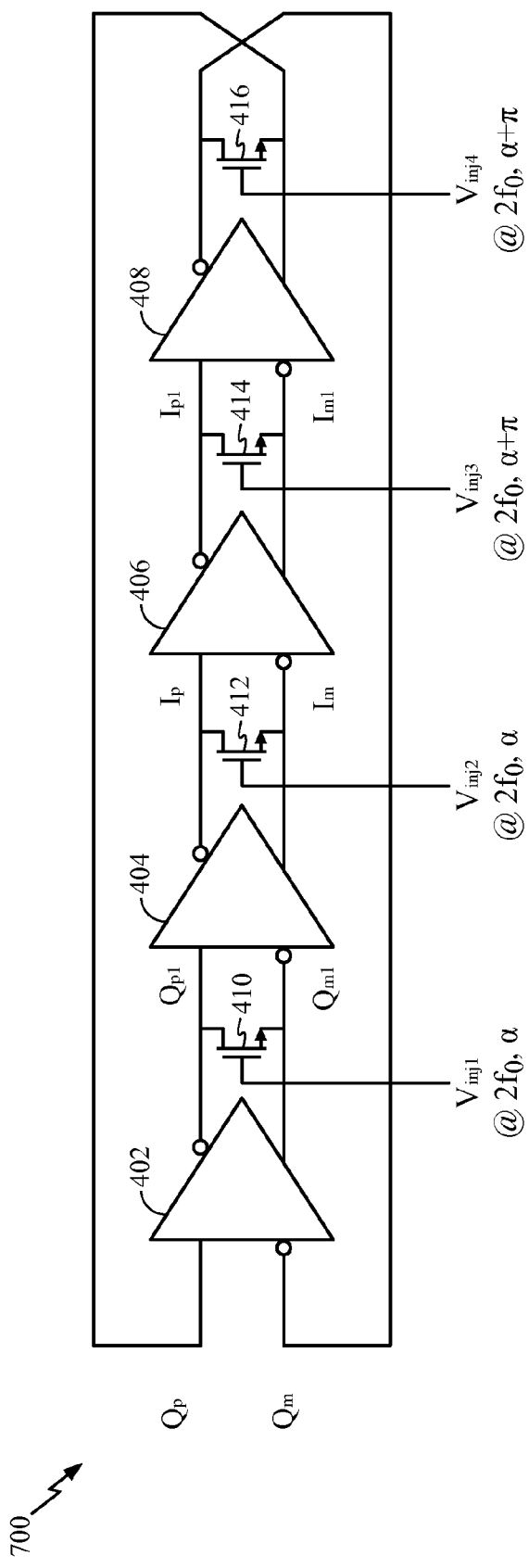
FIG. 7 is a schematic circuit diagram for the programmable LO divider providing a divide-by-three division ratio.

FIG. 7 is a schematic circuit diagram for the programmable LO divider 700 providing a divide-by-three division ratio. The programmable LO divider 700 corresponds to the programmable LO dividers 314, 420. As shown in FIG. 7, a divide-by-three division ratio within the programmable LO divider 700 is obtained through the injection signals $V_{inj1}$, $V_{inj2}$, $V_{inj3}$, $V_{inj4}$, where $V_{inj1}$, $V_{inj2}$, $V_{inj3}$, $V_{inj4}$ each have a frequency of $2f_0$ and phases of α, α, α+π, and α+π, respectively.

Figure 8:
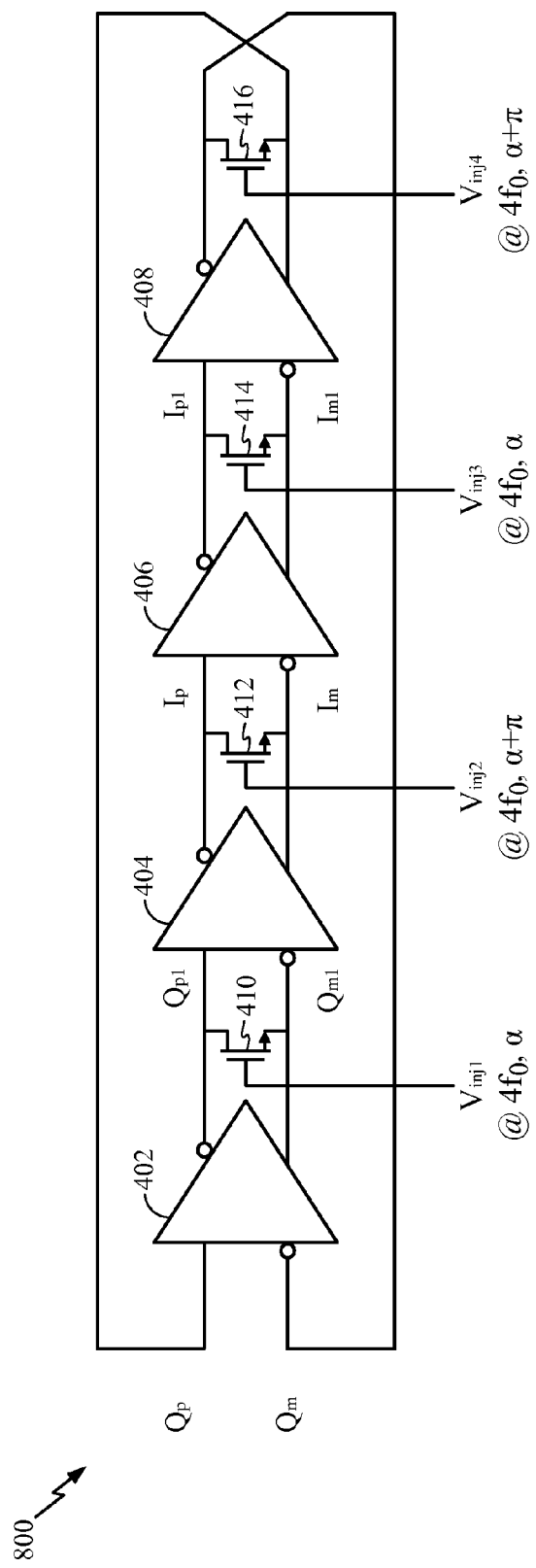
FIG. 8 is a schematic circuit diagram for the programmable LO divider providing a divide-by-four division ratio.

FIG. 8 is a schematic circuit diagram for the programmable LO divider 800 providing a divide-by-four division ratio. The programmable LO divider 800 corresponds to the programmable LO dividers 314, 420. As shown in FIG. 8, a divide-by-four division ratio within the programmable LO divider 800 is obtained through the injection signals $V_{inj1}$, $V_{inj2}$, $V_{inj3}$, $V_{inj4}$, where $V_{inj1}$, $V_{inj2}$, $V_{inj3}$, $V_{inj4}$ each have a frequency of $4f_0$ and phases of α, α+π, α, and α+π, respectively.

Figure 9:
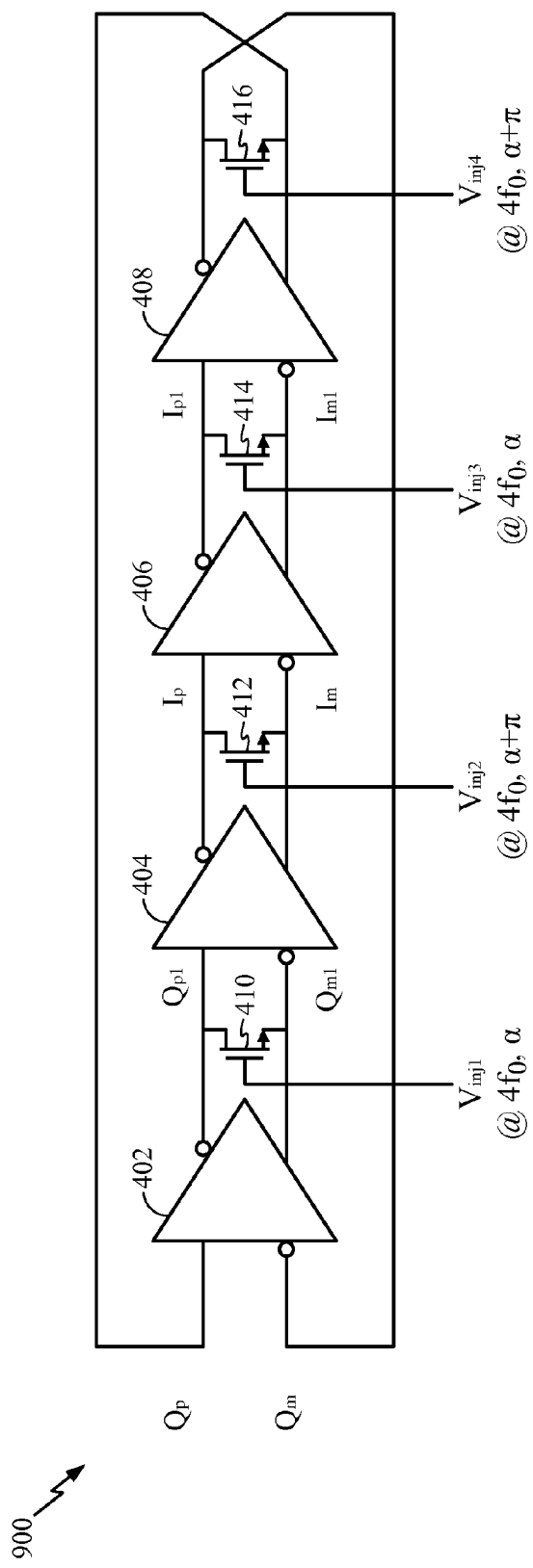
FIG. 9 is a schematic circuit diagram for the programmable LO divider providing a divide-by-five division ratio.

FIG. 9 is a schematic circuit diagram for the programmable LO divider 900 providing a divide-by-five division ratio. The programmable LO divider 900 corresponds to the programmable LO dividers 314, 420. As shown in FIG. 9, a divide-by-five division ratio within the programmable LO divider 900 is obtained through the injection signals $V_{inj1}$, $V_{inj2}$, $V_{inj3}$, $V_{inj4}$, where $V_{inj1}$, $V_{inj2}$, $V_{inj3}$, $V_{inj4}$ each have a frequency of $4f_0$ and phases of α, α+π, α, and α+π, respectively.

Figure 10A:
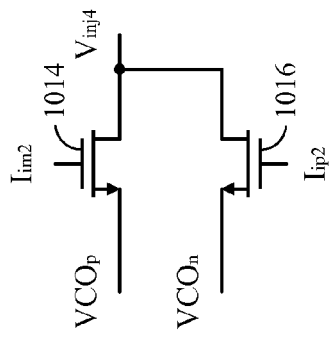
FIGS. 10A-10H are schematic circuit diagrams for generating the injection signals in the programmable harmonic generator.
Figure 10B:
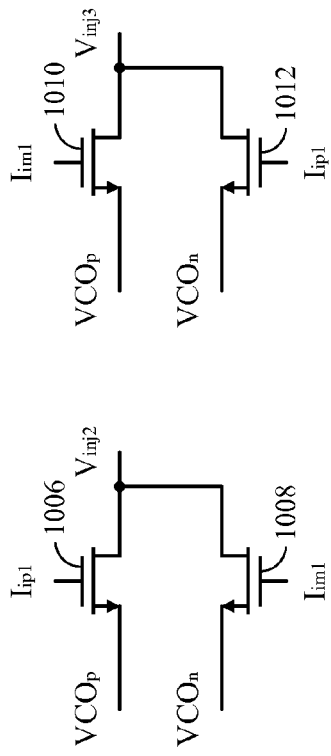
Figure 10C:
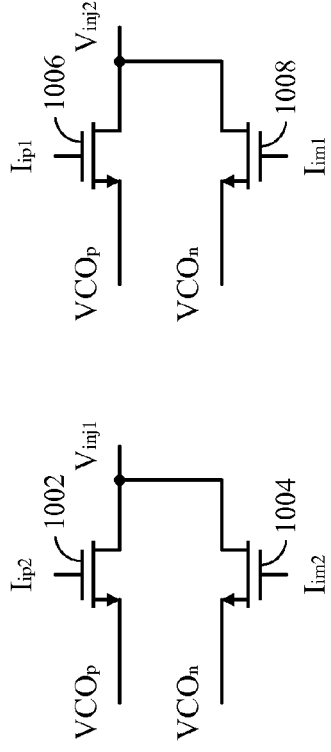
Figure 10D:
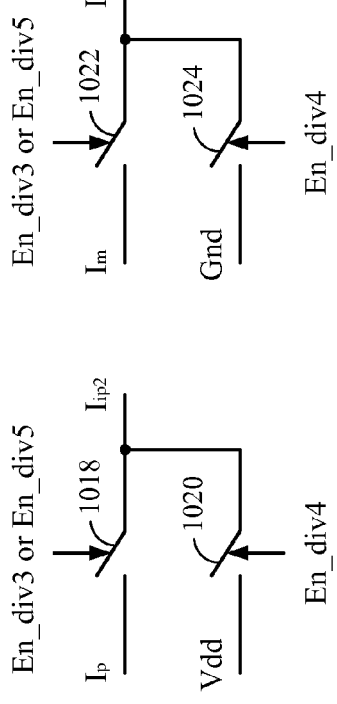
Figure 10E:
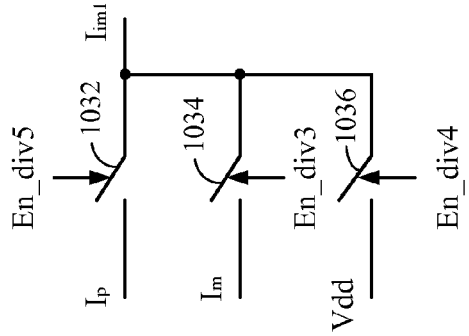
Figure 10F:
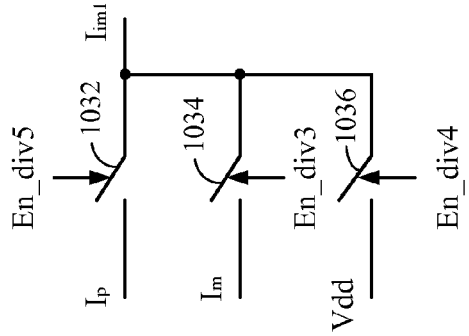
Figure 10G:
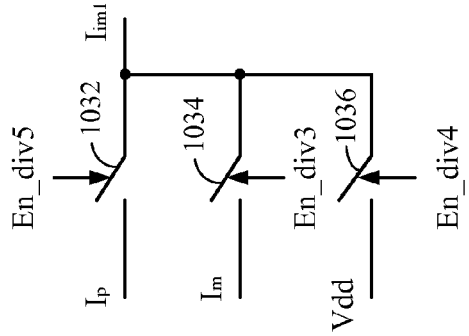
Figure 10H:
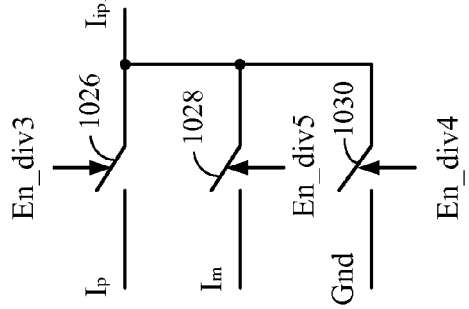

FIGS. 10A-10H are schematic circuit diagrams for generating the injection signals in the programmable harmonic generator 318, 418. Referring to FIG. 10E, a switch 1018 is closed when the division ratio of three is enabled (En_div3) or the division ratio of five is enabled (En_div5) and is opened otherwise. A switch 1020 is closed when the division ratio of four is enabled (En_div4) and is opened otherwise. Accordingly, a signal $I_{ip2}$ is coupled to the LO signal $I_p$ when the division ratio of three or five is enabled and is coupled to a supply voltage Vdd when the division ratio of four is enabled. Referring to FIG. 10F, a switch 1022 is closed when the division ratio of three is enabled (En_div3) or the division ratio of five is enabled (En_div5) and is opened otherwise. A switch 1024 is closed when the division ratio of four is enabled (En_div4) and is opened otherwise. Accordingly, a signal $I_{im2}$ is coupled to the LO signal $I_m$ when the division ratio of three or five is enabled and is coupled to circuit ground (Gnd) when the division ratio of four is enabled. Referring to FIG. 10G, a switch 1026 is closed when the division ratio of three is enabled (En_div3) and is opened otherwise. A switch 1028 is closed when the division ratio of five is enabled (En_div5) and is opened otherwise. A switch 1030 is closed when the division ratio of four is enabled (En_div4) and is opened otherwise. Accordingly, a signal $I_{ip1}$ is coupled to the LO signal $I_p$ when the division ratio of three is enabled, to the LO signal $I_m$ when the division ratio of five is enabled, and to circuit ground when the division ratio of four is enabled. Referring to FIG. 10H, a switch 1032 is closed when the division ratio of five is enabled (En_div5) and is opened otherwise. A switch 1034 is closed when the division ratio of three is enabled (En_div3) and is opened otherwise. A switch 1036 is closed when the division ratio of four is enabled (En_div4) and is opened otherwise. Accordingly, a signal $I_{im1}$ is coupled to the LO signal $I_p$ when the division ratio of five is enabled, to the LO signal $I_m$ when the division ratio of three is enabled, and to the supply voltage Vdd when the division ratio of four is enabled.

Referring to FIG. 10A, a first transistor 1002 is coupled between a first injection signal $V_{im1}$ node and a first VCO signal $VCO_p$, with a drain of the first transistor 1002 coupled to the first injection signal $V_{im1}$ node and a source of the first transistor 1002 coupled to the first VCO signal $VCO_p$. A second transistor 1004 is coupled between the first injection signal $V_{inj1}$ node and a second VCO signal $VCO_n$, with a drain of the second transistor 1004 coupled to the first injection signal $V_{inj1}$ node and a source of the second transistor 1004 coupled to the second VCO signal $VCO_n$. A gate of the first transistor 1002 is coupled to the signal $I_{ip2}$ and a gate of the second transistor 1004 is coupled to the signal $I_{im2}$. While the first and second transistors 1002, 1004 are shown as NMOS transistors, the first and second transistors 1002, 1004 may be BJTs or any type of FETs (e.g., PMOS transistors).

Referring to FIG. 10B, a first transistor 1006 is coupled between a second injection signal $V_{inj2}$ node and a first VCO signal $VCO_p$, with a drain of the first transistor 1006 coupled to the second injection signal $V_{inj2}$ node and a source of the first transistor 1006 coupled to the first VCO signal $VCO_p$. A second transistor 1008 is coupled between the second injection signal $V_{inj2}$ node and a second VCO signal $VCO_n$, with a drain of the second transistor 1008 coupled to the second injection signal $V_{inj2}$ node and a source of the second transistor 1008 coupled to the second VCO signal $VCO_n$. A gate of the first transistor 1006 is coupled to the signal $I_{ip1}$ and a gate of the second transistor 1008 is coupled to the signal $I_{im1}$. While the first and second transistors 1006, 1008 are shown as NMOS transistors, the first and second transistors 1006, 1008 may be BJTs or any type of FETs (e.g., PMOS transistors).

Referring to FIG. 10C, a first transistor 1010 is coupled between a third injection signal $V_{inj3}$ node and a first VCO signal $VCO_p$, with a drain of the first transistor 1010 coupled to the third injection signal $V_{inj3}$ node and a source of the first transistor 1010 coupled to the first VCO signal $VCO_p$. A second transistor 1012 is coupled between the third injection signal $V_{inj3}$ node and a second VCO signal $VCO_n$, with a drain of the second transistor 1012 coupled to the third injection signal $V_{inj3}$ node and a source of the second transistor 1012 coupled to the second VCO signal $VCO_n$. A gate of the first transistor 1010 is coupled to the signal and a gate of the second transistor 1012 is coupled to the signal $I_{ip1}$. While the first and second transistors 1010, 1012 are shown as NMOS transistors, the first and second transistors 1010, 1012 may be BJTs or any type of FETs (e.g., PMOS transistors).

Referring to FIG. 10D, a first transistor 1014 is coupled between a fourth injection signal $V_{inj4}$ node and a first VCO signal $VCO_p$, with a drain of the first transistor 1014 coupled to the fourth injection signal $V_{inj4}$ node and a source of the first transistor 1014 coupled to the first VCO signal $VCO_p$. A second transistor 1016 is coupled between the fourth injection signal $V_{inj4}$ node and a second VCO signal $VCO_n$, with a drain of the second transistor 1016 coupled to the fourth injection signal $V_{inj4}$ node and a source of the second transistor 1016 coupled to the second VCO signal $VCO_n$. A gate of the first transistor 1014 is coupled to the signal $I_{im2}$ and a gate of the second transistor 1016 is coupled to the signal $I_{ip2}$. While the first and second transistors 1014, 1016 are shown as NMOS transistors, the first and second transistors 1014, 1016 may be BJTs or any type of FETs (e.g., PMOS transistors).

Figure 11:
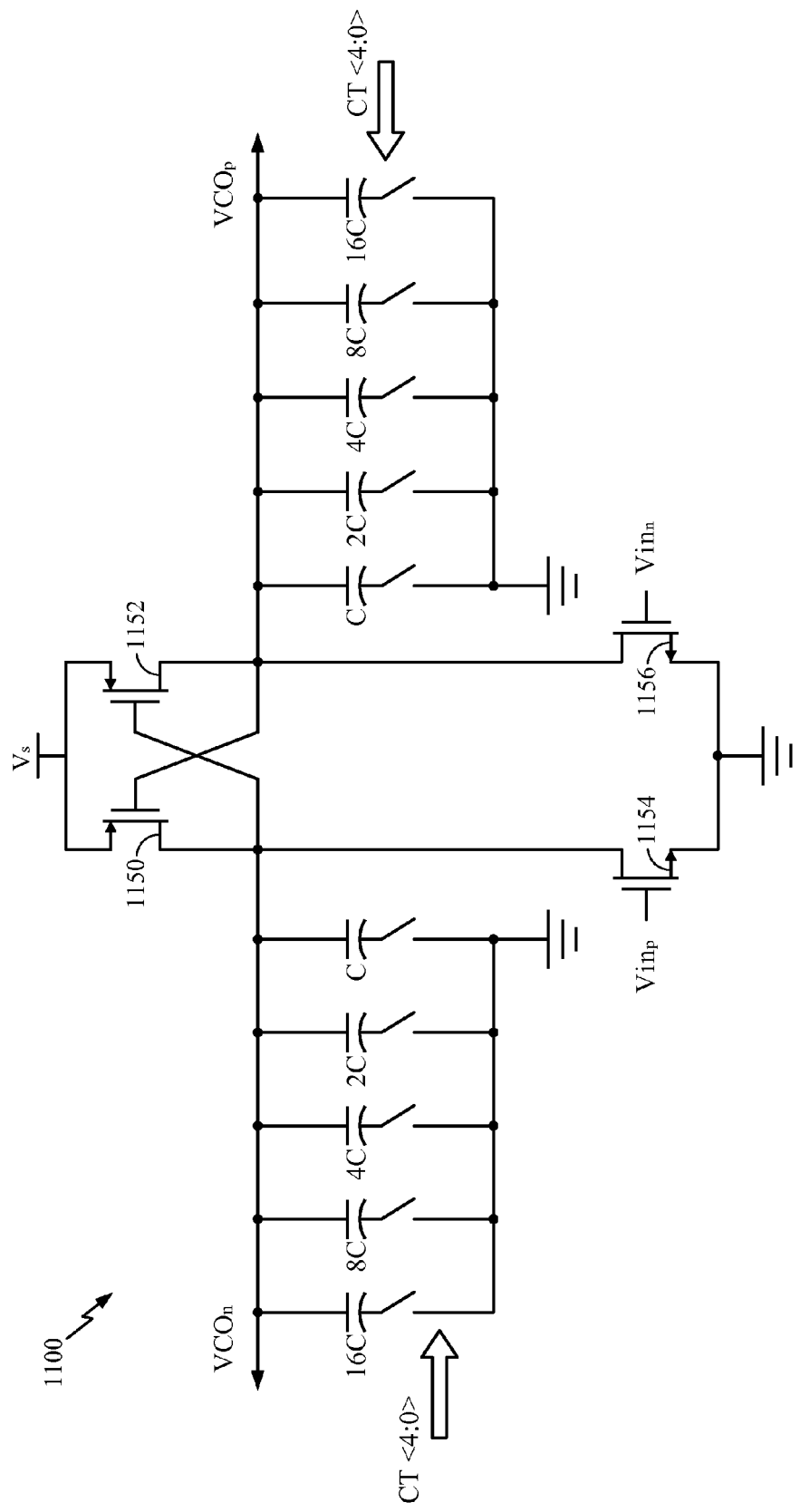
FIG. 11 is a schematic circuit diagram of an example of a ring oscillator delay stage within the programmable LO divider.

FIG. 11 is a schematic circuit diagram 1100 of an example of a ring oscillator delay stage within the programmable LO divider 314, 420. The ring oscillator delay stages 402, 404, 406, 408 may each include a differential pair of transistors 1150, 1152, such as the cross-coupled transistors 1150, 1152. Sources of the transistors 1150, 1152 may be coupled together and to a supply voltage $V_s$. A gate of the transistor 1152 may be coupled to a drain of the transistor 1150 and a gate of the transistor 1150 may be coupled to a drain of the transistor 1152. The transistors 1150, 1152 may be PMOS transistors. A drain of the transistor 1150 may be coupled to a drain of a transistor 1154 and a drain of the transistor 1152 may be coupled to a drain of a transistor 1156. Sources of the transistors 1154, 1156 may be coupled together and to a circuit ground. A gate of the transistor 1154 may be coupled to a first input $Vin_p$ and a gate of the transistor 1156 may be coupled to a second input $Vin_n$. The transistors 1154, 1156 may be NMOS transistors. Drains of the transistors 1152, 1156 are coupled to a first output node $VCO_p$ and drains of the transistors 1150, 1154 are coupled to a second output node $VCO_n$. A first capacitor bank may be coupled between the first output node $VCO_p$ and circuit ground. A second capacitor bank may be coupled between the second output node $VCO_n$ and circuit ground. The first and second capacitor banks may be configured with n-bits and may be binary-weighted, with capacitance units of C, 2C, . . . , $2^{-1}$C. The first and second capacitor banks are coarsely tuned through a course tuning (CT) procedure to adjust the programmable LO divider 314, 420 to the desired target LO frequency. For example, the ring oscillator delay stage includes 5-bit binary-weighted capacitor banks. Through a CT procedure, each of the five binary-weighted capacitors in each of the first and second capacitor banks are either connected or disconnected.

Figure 12:
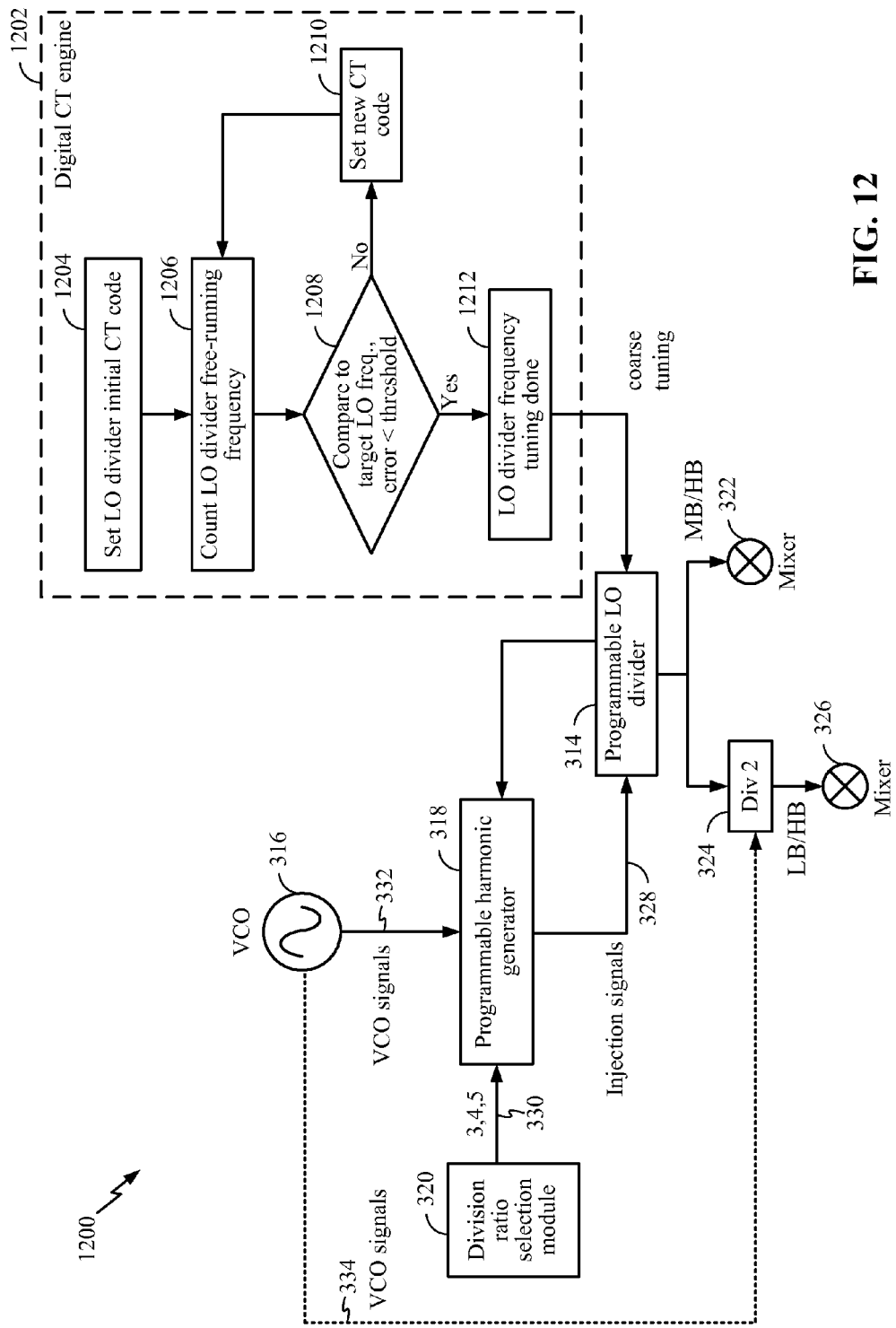
FIG. 12 is a block diagram illustrating LO signal generation using the programmable harmonic generator, the programmable LO divider, and a course tuning module.

FIG. 12 is a block diagram 1200 illustrating LO signal generation using the programmable harmonic generator 318, the programmable LO divider 314, and a CT module 1202. The CT module 1202 performs a CT procedure to tune a free-running frequency and optimize a phase noise of the LO signal outputs of the programmable LO divider 314. In step 1204, the CT module 1202 sets an initial capacitance of the programmable LO divider 314. When the programmable LO divider 314 includes ring oscillator delay stages as shown in FIG. 11, the CT module 1202 adjusts an initial capacitance of each of the first and second capacitor banks of the ring oscillator delay stages in order to set an initial frequency of the LO signal outputs of the programmable LO divider 314. In step 1206, the CT module 1202 determines the free-running frequency of the LO signal outputs of the programmable LO divider 314. In step 1208, the CT module 1202 compares the current free-running frequency of the LO signal outputs to a desired target LO frequency. If the difference or error is greater than or equal to a threshold, in step 1210, the CT module 1202 further adjusts the capacitance, and returns to step 1206. When the difference or error is less than the threshold, in step 1212, the CT module 1202 terminates the CT procedure. The threshold T is the acceptable error E in the free-running frequency of the LO signal outputs of the programmable LO divider 314. If the LO signal outputs should be at a frequency of $f_0$, but are at a frequency of $f_1$, and $f_1$ is acceptable, then the error is $E=|f_1-f_0|$. The threshold T is equal to the acceptable error E.

Referring again to FIG. 2 and FIG. 12, the division ratio selection module 320 selects a division ratio of a plurality of division ratios. The data processor/controller 210 may configure the injection signal generator module 318 based on the selected division ratio. The injection signal generator module is configured by the data processor/controller 210 to generate injection signals based on local oscillator signals, a received VCO signal, and the configuration. The CT module 1202, which may be implemented by the data processor/controller 210, tunes the local oscillator generator module 314 to provide the local oscillator signals at a desired target frequency. The local oscillator generator module 314 generates the local oscillator signals based on the injection signals.

Figure 13:
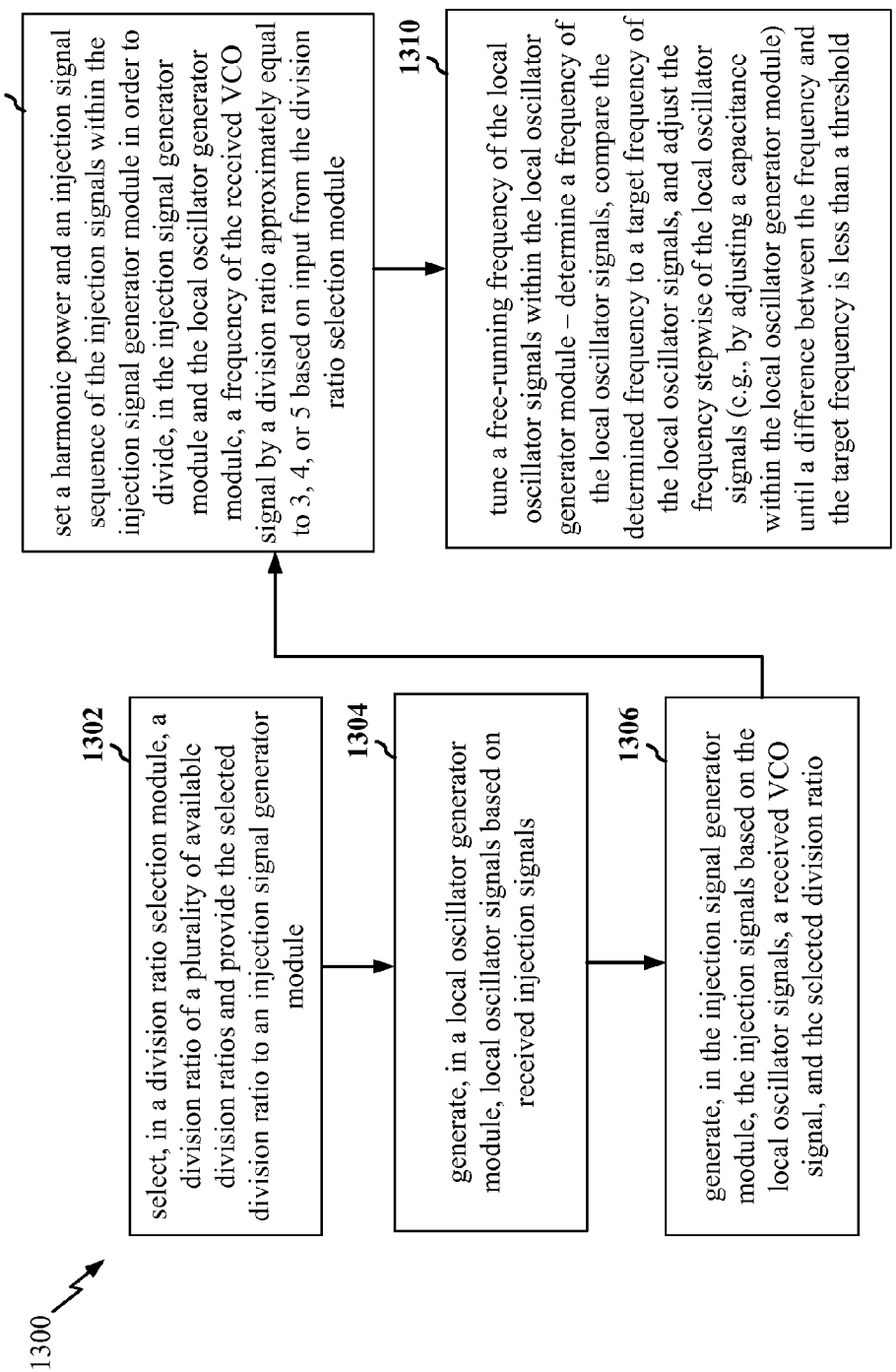
FIG. 13 is a flow chart of a method of generating LO signals.

FIG. 13 is a flow chart 1300 of a method of generating LO signals. The method may be performed by an apparatus, such as one or more of the programmable harmonic generator module 318, the programmable LO divider module 314, the division ratio selection module 320, the VCO module 316, and the CT module 1202. The apparatus generates LO signals. In step 1302, the apparatus may select, in a division ratio selection module, a division ratio of a plurality of available division ratios, and provide the selected division ratio to an injection signal generator module. In step 1304, the apparatus may generate, in a LO generator module, the LO signals based on received injection signals. In step 1306, the apparatus may generate, in an injection signal generator module, the injection signals based on the LO signals, a received VCO signal, and the selected division ratio.

The LO generator module may have a plurality of LO outputs and a plurality of injection signal inputs. The LO module may be configured to generate the LO signals on the LO outputs based on injection signals received on the injection signal inputs. The injection signal generator module may be to the LO generator module. The injection signal generator module may have a plurality of LO inputs and a plurality of injection signal outputs. The LO inputs may be coupled to the LO outputs. The injection signal outputs may be coupled to the injection signal inputs. The injection signal generator module may be configured to generate injection signals on the injection signal outputs based on the LO signals received on the LO inputs and based on a received VCO signal.

In step 1308, the apparatus may set a harmonic power and an injection signal sequence of the injection signals within the injection signal generator module. The injection signal generator module may be programmable to provide at least three different sets of injection signals. For example, the injection signal generator module may be programmable to provide a set of injection signals corresponding to each of the division ratios of three, four, and five. The LO generator module may include a plurality of delay stages and specifically include n delay stages and n injection signal inputs. For example, referring to FIG. 4, the ring oscillator includes four delay stages and therefore n=4. As shown in FIG. 4, each of the n injection signal inputs may be between a different pair of delay stages, and each of the n injection signal inputs may be independently controlled by the injection signal generator module. In step 1310, the apparatus may tune, in a tuning module coupled to the LO generator module, a frequency of the LO signals. The apparatus may adjust, in the tuning module, a capacitance of each of the delay stages in order to tune the frequency of the LO signals. The apparatus may tune a frequency of the LO signals by determining a frequency of the LO signals, comparing the determined frequency to a target frequency of the LO signals, and adjusting the frequency stepwise of the LO signals until a difference between the frequency and the target frequency is less than a threshold.

In step 1302, the division ratio may be selected from one of at least three available division ratios. The at least three available division ratios may include a division ratio of approximately 3, a division ratio of approximately 4, and division ratio of approximately 5. In step 1308, the apparatus may divide, in the injection signal generator module and the LO generator module, a frequency of the received VCO signal by a division ratio approximately equal to 3, 4, or 5 based on input from the division ratio selection module. The apparatus may provide the LO signals at each of the divided frequencies separately based on the input from the division ratio selection module.

The apparatus may provide, in a VCO module, the VCO signal to the injection signal generator module. For a divide-by-three division ratio, the apparatus may receive, in the injection signal generator module, the VCO signal at a frequency approximately equal to three times a desired frequency of the LO signals. The apparatus may provide, based on the received VCO signal and in the injection signal generator module, a first injection signal, a second injection signal, a third injection signal, and a fourth injection signal at a frequency approximately equal to the frequency of the VCO signal minus a frequency of the LO signals. The first injection signal may have a phase approximately equal to α, the second injection signal may have a phase approximately equal to α, the third injection signal may have a phase approximately equal to α+π, and the fourth injection signal may have a phase approximately equal to α+π. The apparatus may generate, based on the received injection signals and in the LO generator module, the LO signals at a frequency approximately equal to one half of the frequency of the injections signals. The LO generator module may include four delay stages coupled in series. The four delay stages may include a first delay stage coupled in series between a second delay stage and a fourth delay stage, the second delay stage coupled in series between the first delay stage and a third delay stage, the third delay stage coupled in series between the second delay stage and the fourth delay stage, and the fourth delay stage coupled in series between the third delay stage and the first delay stage. The first injection signal may be applied to a first injection signal input between the first delay stage and the second delay stage, the second injection signal may be applied to a second injection signal input between the second delay stage and the third delay stage, the third injection signal may be applied to a third injection signal input between the third delay stage and the fourth delay stage, and the fourth injection signal may be applied to a fourth injection signal input between the fourth delay stage and the first delay stage.

For a divide-by-four division ratio, the apparatus may receive, in the injection signal generator module, the VCO signal at a frequency approximately equal to four times a desired frequency of the LO signals. The apparatus may provide, based on the received VCO signal and in the injection signal generator module, a first injection signal, a second injection signal, a third injection signal, and a fourth injection signal at a frequency approximately equal to the frequency of the VCO signal. The first injection signal may have a phase approximately equal to α, the second injection signal may have a phase approximately equal to α+π, the third injection signal may have a phase approximately equal to α, and the fourth injection signal may have a phase approximately equal to α+π. The apparatus may generate, based on the received injection signals and in the LO generator module, the LO signals at a frequency approximately equal to one fourth of the frequency of the injections signals. The LO generator module may include four delay stages coupled in series. The four delay stages may include a first delay stage coupled in series between a second delay stage and a fourth delay stage, the second delay stage coupled in series between the first delay stage and a third delay stage, the third delay stage coupled in series between the second delay stage and the fourth delay stage, and the fourth delay stage coupled in series between the third delay stage and the first delay stage. The first injection signal may be applied to a first injection signal input between the first delay stage and the second delay stage, the second injection signal may be applied to a second injection signal input between the second delay stage and the third delay stage, the third injection signal may be applied to a third injection signal input between the third delay stage and the fourth delay stage, and the fourth injection signal may be applied to a fourth injection signal input between the fourth delay stage and the first delay stage.

For a divide-by-five division ratio, the apparatus may receive, in the injection signal generator module, the VCO signal at a frequency approximately equal to five times a desired frequency of the LO signals. The apparatus may provide, based on the received VCO signal and in the injection signal generator module, a first injection signal, a second injection signal, a third injection signal, and a fourth injection signal at a frequency approximately equal to the frequency of the VCO signal minus a frequency of the LO signals. The first injection signal may have a phase approximately equal to $\alpha$, the second injection signal may have a phase approximately equal to $\alpha+\pi$, the third injection signal may have a phase approximately equal to $\alpha$, and the fourth injection signal may have a phase approximately equal to $\alpha+\pi$. The apparatus may generate, based on the received injection signals and in the LO generator module, the LO signals at a frequency approximately equal to one fourth of the frequency of the injections signals. The LO generator module may include four delay stages coupled in series. The four delay stages may include a first delay stage coupled in series between a second delay stage and a fourth delay stage, the second delay stage coupled in series between the first delay stage and a third delay stage, the third delay stage coupled in series between the second delay stage and the fourth delay stage, and the fourth delay stage coupled in series between the third delay stage and the first delay stage. The first injection signal may be applied to a first injection signal input between the first delay stage and the second delay stage, the second injection signal may be applied to a second injection signal input between the second delay stage and the third delay stage, the third injection signal may be applied to a third injection signal input between the third delay stage and the fourth delay stage, and the fourth injection signal may be applied to a fourth injection signal input between the fourth delay stage and the first delay stage.

In one configuration, the received VCO signal includes a first VCO signal and a second VCO signal, the LO generator module has a plurality of LO outputs, the injection signal generator module has a plurality of injection signal inputs, the LO outputs include a first LO output signal and a second LO output signal, the injection signal generator module includes a first transistor and a second transistor, an injection signal output of the plurality of injection signal outputs is coupled to a drain of the first transistor and to a drain of the second transistor, a source of the first transistor is coupled to the first VCO signal, and a source of the second transistor is coupled to the second VCO signal. In a first configuration, a gate of the first transistor is coupled to the first LO output signal when a division ratio of three is selected, to a supply voltage when a division ratio of four is selected, and to the first LO output signal when a division ratio of five is selected. In addition, a gate of the second transistor is coupled to the second LO output signal when a division ratio of three is selected, to a circuit ground when a division ratio of four is selected, and to the second LO output signal when a division ratio of five is selected. In a second configuration, a gate of the first transistor is coupled to the first LO output signal when a division ratio of three is selected, to a circuit ground when a division ratio of four is selected, and to the second LO output signal when a division ratio of five is selected. In addition, a gate of the second transistor is coupled to the second LO output signal when a division ratio of three is selected, to a supply voltage when a division ratio of four is selected, and to the first LO output signal when a division ratio of five is selected. In a third configuration, a gate of the first transistor is coupled to the second LO output signal when a division ratio of three is selected, to a supply voltage when a division ratio of four is selected, and to the first LO output signal when a division ratio of five is selected. In addition, a gate of the second transistor is coupled to the first LO output signal when a division ratio of three is selected, to a circuit ground when a division ratio of four is selected, and to the second LO output signal when a division ratio of five is selected. In a fourth configuration, a gate of the first transistor is coupled to the second LO output signal when a division ratio of three is selected, to a circuit ground when a division ratio of four is selected, and to the second LO output signal when a division ratio of five is selected. In addition, a gate of the second transistor is coupled to the first LO output signal when a division ratio of three is selected, to a supply voltage when a division ratio of four is selected, and to the first LO output signal when a division ratio of five is selected.

Referring again to FIG. 3, an apparatus may include the programmable harmonic generator module 318, the programmable LO divider module 314, the VCO module 316, and division ratio selection module 320, and/or the data processor/controller 210. The apparatus generates LO signals. The apparatus includes means for generating, in a LO generator module, the LO signals based on received injection signals. The apparatus further includes means for generating, in an injection signal generator module, the injection signals based on the LO signals and a received VCO signal. In one configuration, the LO generator module includes a plurality of delay stages. In such a configuration, the apparatus further includes means for tuning, in a tuning module coupled to the LO generator module, a frequency of the LO signals. The apparatus may further include means for adjusting, in the tuning module, a capacitance of each of the delay stages in order to tune the frequency of the LO signals. The means for tuning may be configured to determine a frequency of the LO signals, compare the determined frequency to a target frequency of the LO signals, and adjust the frequency stepwise of the LO signals until a difference between the frequency and the target frequency is less than a threshold. The apparatus may further include means for selecting, in a division ratio selection module, a division ratio of a plurality of available division ratios, and means for providing the selected division ratio to the injection signal generator module. In such a configuration, the injection signals are generated based on the received selected division ratio. The apparatus may further include means for dividing, in the injection signal generator module and the LO generator module, a frequency of the received VCO signal by a division ratio approximately equal to 3, 4, or 5 based on input from the division ratio selection module, and means for providing the LO signals at each of the divided frequencies separately based on the input from the division ratio selection module. The apparatus may further include means for providing, in a VCO module, the VCO signal to the injection signal generator module. The apparatus may further include means for receiving, in the injection signal generator module, the VCO signal at a frequency approximately equal to three times a desired frequency of the LO signals. The apparatus may further include means for providing, based on the received VCO signal and in the injection signal generator module, a first injection signal, a second injection signal, a third injection signal, and a fourth injection signal at a frequency approximately equal to the frequency of the VCO signal minus a frequency of the LO signals. The first injection signal has a phase approximately equal to a, the second injection signal has a phase approximately equal to $\alpha$, the third injection signal has a phase approximately equal to $\alpha+\pi$, and the fourth injection signal has a phase approximately equal to $\alpha+\pi$. The apparatus may further include means for generating, based on the received injection signals and in the LO generator module, the LO signals at a frequency approximately equal to one half of the frequency of the injections signals. The apparatus may further include means for receiving, in the injection signal generator module, the VCO signal at a frequency approximately equal to four times a desired frequency of the LO signals. The apparatus may further include means for providing, based on the received VCO signal and in the injection signal generator module, a first injection signal, a second injection signal, a third injection signal, and a fourth injection signal at a frequency approximately equal to the frequency of the VCO signal. The first injection signal has a phase approximately equal to α, the second injection signal has a phase approximately equal to α+π, the third injection signal has a phase approximately equal to α, and the fourth injection signal has a phase approximately equal to α+π. The apparatus may further include means for generating, based on the received injection signals and in the LO generator module, the LO signals at a frequency approximately equal to one fourth of the frequency of the injections signals. The apparatus may further include means for receiving, in the injection signal generator module, the VCO signal at a frequency approximately equal to five times a desired frequency of the LO signals. The apparatus may further include means for providing, based on the received VCO signal and in the injection signal generator module, a first injection signal, a second injection signal, a third injection signal, and a fourth injection signal at a frequency approximately equal to the frequency of the VCO signal minus a frequency of the LO signals. The first injection signal has a phase approximately equal to α, the second injection signal has a phase approximately equal to α+π, the third injection signal has a phase approximately equal to α, and the fourth injection signal has a phase approximately equal to α+π. The apparatus may further include means for generating, based on the received injection signals and in the LO generator module, the LO signals at a frequency approximately equal to one fourth of the frequency of the injections signals. The aforementioned means may be one or more of the programmable harmonic generator module 318, the programmable LO divider module 314, the VCO module 316, and division ratio selection module 320, the data processor/controller 210, the computer-readable medium 212, and/or the computer-readable medium 216 configured to perform the functions recited by the aforementioned means.

Referring again to FIG. 3, an apparatus may include the programmable harmonic generator module 318, the programmable LO divider module 314, the VCO module 316, and division ratio selection module 320, and/or the data processor/controller 210. The apparatus generates LO signals. The apparatus includes means for selecting a division ratio of a plurality of division ratios. The apparatus further includes means for configuring an injection signal generator module based on the selected division ratio. The injection signal generator module generates injection signals based on LO signals, a received VCO signal, and the configuration. The apparatus further includes means for tuning a LO generator module to provide the LO signals at a desired target frequency. The LO generator module generates the LO signals based on the injection signals. The aforementioned means may be one or more of the programmable harmonic generator module 318, the programmable LO divider module 314, the VCO module 316, and division ratio selection module 320, the data processor/controller 210, the computer-readable medium 212, and/or the computer-readable medium 216 configured to perform the functions recited by the aforementioned means.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. An apparatus for generating local oscillator signals, comprising:
    a local oscillator generator module having a plurality of local oscillator outputs and a plurality of injection signal inputs, the local oscillator generator module being configured to generate local oscillator signals on the local oscillator outputs based on injection signals received on the injection signal inputs; and
    an injection signal generator module coupled to the local oscillator generator module, the injection signal generator module having a plurality of local oscillator inputs and a plurality of injection signal outputs, the local oscillator inputs being coupled to the local oscillator outputs, the injection signal outputs being coupled to the injection signal inputs, the injection signal generator module being configured to generate injection signals on the injection signal outputs based on the local oscillator signals received on the local oscillator inputs and based on a received voltage controlled oscillator (VCO) signal,
    wherein the injection signal generator module is programmable to concurrently provide at least three different sets of injection signals.

2. The apparatus of claim 1, wherein the local oscillator generator module comprises n delay stages and n injection signal inputs, each of the n injection signal inputs being between a different pair of delay stages, each of the n injection signal inputs being independently controlled by the injection signal generator module.

3. The apparatus of claim 1, wherein the local oscillator generator module comprises a plurality of delay stages, and the apparatus further comprises a tuning module coupled to the local oscillator generator module, the tuning module being configured to tune a frequency of the local oscillator signals.

4. The apparatus of claim 3, wherein the tuning module is configured to adjust a capacitance of each of the delay stages in order to tune the frequency of the local oscillator signals.

5. The apparatus of claim 3, wherein the tuning module is configured to determine a frequency of the local oscillator signals, to compare the determined frequency to a target frequency of the local oscillator signals, and to adjust the frequency stepwise of the local oscillator signals until a difference between the frequency and the target frequency is less than a threshold.

6. The apparatus of claim 1, further comprising a division ratio selection module configured to select a division ratio of a plurality of available division ratios and to provide the selected division ratio to the injection signal generator module, wherein the injection signal generator module is further configured to generate the injection signals based on the received selected division ratio.

7. The apparatus of claim 6, wherein the division ratio selection module is configured to select the division ratio from one of at least three available division ratios.

8. The apparatus of claim 7, wherein the at least three available division ratios include a division ratio of approximately 3, a division ratio of approximately 4, and division ratio of approximately 5.

9. The apparatus of claim 7, wherein the injection signal generator module and the local oscillator generator module together are configured to divide a frequency of the received VCO signal by a division ratio approximately equal to 3, 4, or 5 based on input from the division ratio selection module, and to provide the local oscillator signals at each of the divided frequencies separately based on the input from the division ratio selection module.

10. The apparatus of claim 1, further comprising a VCO module configured to provide the VCO signal to the injection signal generator module.

11. The apparatus of claim 1, wherein the injection signal generator module is configured to receive the VCO signal at a frequency approximately equal to three times a desired frequency of the local oscillator signals.

12. The apparatus of claim 1, wherein the injection signal generator module is configured to receive the VCO signal at a frequency approximately equal to four times a desired frequency of the local oscillator signals.

13. The apparatus of claim 1, wherein the injection signal generator module is configured to receive the VCO signal at a frequency approximately equal to five times a desired frequency of the local oscillator signals.

14. The apparatus of claim 1, wherein the received VCO signal comprises a first VCO signal and a second VCO signal; the local oscillator outputs comprise a first local oscillator output signal and a second local oscillator output signal; the injection signal generator module comprises a first transistor and a second transistor; an injection signal output of the plurality of injection signal outputs is coupled to a drain of the first transistor and to a drain of the second transistor; a source of the first transistor is coupled to the first VCO signal; and a source of the second transistor is coupled to the second VCO signal.

15. The apparatus of claim 14, wherein a gate of the first transistor is coupled to the first local oscillator output signal when a division ratio of three is selected, to a circuit ground when a division ratio of four is selected, and to the second local oscillator output signal when a division ratio of five is selected; and a gate of the second transistor is coupled to the second local oscillator output signal when a division ratio of three is selected, to a supply voltage when a division ratio of four is selected, and to the first local oscillator output signal when a division ratio of five is selected.

16. The apparatus of claim 14, wherein a gate of the first transistor is coupled to the second local oscillator output signal when a division ratio of three is selected, to a supply voltage when a division ratio of four is selected, and to the first local oscillator output signal when a division ratio of five is selected; and a gate of the second transistor is coupled to the first local oscillator output signal when a division ratio of three is selected, to a circuit ground when a division ratio of four is selected, and to the second local oscillator output signal when a division ratio of five is selected.

17. The apparatus of claim 14, wherein a gate of the first transistor is coupled to the second local oscillator output signal when a division ratio of three is selected, to a circuit ground when a division ratio of four is selected, and to the local oscillator output signal when a division ratio of five is selected; and a gate of the second transistor is coupled to local oscillator output signal when a division ratio of three is selected, to a supply voltage when a division ratio of four is selected, and to the first local oscillator output signal when a division ratio of five is selected.

18. An apparatus for generating local oscillator signals, comprising:
  a local oscillator generator module having a plurality of local oscillator outputs and a plurality of injection signal inputs, the local oscillator generator module being configured to generate local oscillator signals on the local oscillator outputs based on injection signals received on the injection signal inputs; and
  an injection signal generator module coupled to the local oscillator generator module, the injection signal generator module having a plurality of local oscillator inputs and a plurality of injection signal outputs, the local oscillator inputs being coupled to the local oscillator outputs, the injection signal outputs being coupled to the injection signal inputs, the injection signal generator module being configured to generate injection signals on the injection signal outputs based on the local oscillator signals received on the local oscillator inputs and based on a received voltage controlled oscillator (VCO) signal,
  wherein the injection signal generator module is configured to receive the VCO signal at a frequency approximately equal to three times a desired frequency of the local oscillator signals, and
  wherein based on the received VCO signal, the injection signal generator module is configured to provide a first injection signal, a second injection signal, a third injection signal, and a fourth injection signal at a frequency approximately equal to the frequency of the VCO signal minus a frequency of the local oscillator signals, the first injection signal having a phase approximately equal to $\alpha$, the second injection signal having a phase approximately equal to $\alpha$, the third injection signal having a phase approximately equal to $\alpha+\pi$, and the fourth injection signal having a phase approximately equal to $\alpha+\pi$.

19. The apparatus of claim 18, wherein based on the received injection signals, the local oscillator generator module is configured to generate the local oscillator signals at a frequency approximately equal to one half of the frequency of the injections signals.

20. The apparatus of claim 18, wherein the local oscillator generator module comprises four delay stages coupled in series, the four delay stages comprising a first delay stage coupled in series between a second delay stage and a fourth delay stage, the second delay stage coupled in series between the first delay stage and a third delay stage, the third delay stage coupled in series between the second delay stage and the fourth delay stage, the fourth delay stage coupled in series between the third delay stage and the first delay stage, wherein the first injection signal is applied to a first injection signal input between the first delay stage and the second delay stage, the second injection signal is applied to a second injection signal input between the second delay stage and the third delay stage, the third injection signal is applied to a third injection signal input between the third delay stage and the fourth delay stage, and the fourth injection signal is applied to a fourth injection signal input between the fourth delay stage and the first delay stage.

21. An apparatus for generating local oscillator signals, comprising:
   a local oscillator generator module having a plurality of local oscillator outputs and a plurality of injection signal inputs, the local oscillator generator module being configured to generate local oscillator signals on the local oscillator outputs based on injection signals received on the injection signal inputs; and
   an injection signal generator module coupled to the local oscillator generator module, the injection signal generator module having a plurality of local oscillator inputs and a plurality of injection signal outputs, the local oscillator inputs being coupled to the local oscillator outputs, the injection signal outputs being coupled to the injection signal inputs, the injection signal generator module being configured to generate injection signals on the injection signal outputs based on the local oscillator signals received on the local oscillator inputs and based on a received voltage controlled oscillator (VCO) signal,
   wherein the injection signal generator module is configured to receive the VCO signal at a frequency approximately equal to four times a desired frequency of the local oscillator signals, and
   wherein based on the received VCO signal, the injection signal generator module is configured to provide a first injection signal, a second injection signal, a third injection signal, and a fourth injection signal at a frequency approximately equal to the frequency of the VCO signal, the first injection signal having a phase approximately equal to $\alpha$, the second injection signal having a phase approximately equal to $\alpha+\pi$, the third injection signal having a phase approximately equal to $\alpha$, and the fourth injection signal having a phase approximately equal to $\alpha+\pi$.

22. The apparatus of claim 21, wherein based on the received injection signals, the local oscillator generator module is configured to generate the local oscillator signals at a frequency approximately equal to one fourth of the frequency of the injections signals.

23. The apparatus of claim 21, wherein the local oscillator generator module comprises four delay stages coupled in series, the four delay stages comprising a first delay stage coupled in series between a second delay stage and a fourth delay stage, the second delay stage coupled in series between the first delay stage and a third delay stage, the third delay stage coupled in series between the second delay stage and the fourth delay stage, the fourth delay stage coupled in series between the third delay stage and the first delay stage, wherein the first injection signal is applied to a first injection signal input between the first delay stage and the second delay stage, the second injection signal is applied to a second injection signal input between the second delay stage and the third delay stage, the third injection signal is applied to a third injection signal input between the third delay stage and the fourth delay stage, and the fourth injection signal is applied to a fourth injection signal input between the fourth delay stage and the first delay stage.

24. An apparatus for generating local oscillator signals, comprising:
   a local oscillator generator module having a plurality of local oscillator outputs and a plurality of injection signal inputs, the local oscillator generator module being configured to generate local oscillator signals on the local oscillator outputs based on injection signals received on the injection signal inputs; and
   an injection signal generator module coupled to the local oscillator generator module, the injection signal generator module having a plurality of local oscillator inputs and a plurality of injection signal outputs, the local oscillator inputs being coupled to the local oscillator outputs, the injection signal outputs being coupled to the injection signal inputs, the injection signal generator module being configured to generate injection signals on the injection signal outputs based on the local oscillator signals received on the local oscillator inputs and based on a received voltage controlled oscillator (VCO) signal,
   wherein the injection signal generator module is configured to receive the VCO signal at a frequency approximately equal to five times a desired frequency of the local oscillator signals, and
   wherein based on the received VCO signal, the injection signal generator module is configured to provide a first injection signal, a second injection signal, a third injection signal, and a fourth injection signal at a frequency approximately equal to the frequency of the VCO signal minus a frequency of the local oscillator signals, the first injection signal having a phase approximately equal to $\alpha$, the second injection signal having a phase approximately equal to $\alpha+\pi$, the third injection signal having a phase approximately equal to $\alpha$, and the fourth injection signal having a phase approximately equal to $\alpha+\pi$.

25. The apparatus of claim 24, wherein based on the received injection signals, the local oscillator generator module is configured to generate the local oscillator signals at a frequency approximately equal to one fourth of the frequency of the injections signals.

26. The apparatus of claim 24, wherein the local oscillator generator module comprises four delay stages coupled in series, the four delay stages comprising a first delay stage coupled in series between a second delay stage and a fourth delay stage, the second delay stage coupled in series between the first delay stage and a third delay stage, the third delay stage coupled in series between the second delay stage and the fourth delay stage, the fourth delay stage coupled in series between the third delay stage and the first delay stage, wherein the first injection signal is applied to a first injection signal input between the first delay stage and the second delay stage, the second injection signal is applied to a second injection signal input between the second delay stage and the third delay stage, the third injection signal is applied to a third injection signal input between the third delay stage and the fourth delay stage, and the fourth injection signal is applied to a fourth injection signal input between the fourth delay stage and the first delay stage.

27. An apparatus for generating local oscillator signals, comprising:
   a local oscillator generator module having a plurality of local oscillator outputs and a plurality of injection signal inputs, the local oscillator generator module being configured to generate local oscillator signals on the local oscillator outputs based on injection signals received on the injection signal inputs; and
   an injection signal generator module coupled to the local oscillator generator module, the injection signal generator module having a plurality of local oscillator inputs and a plurality of injection signal outputs, the local oscillator inputs being coupled to the local oscillator outputs, the injection signal outputs being coupled to the injection signal inputs, the injection signal generator module being configured to generate injection signals on the injection signal outputs based on the local oscillator signals received on the local oscillator inputs and based on a received voltage controlled oscillator (VCO) signal, wherein the received VCO signal comprises a first VCO signal and a second VCO signal; the local oscillator outputs comprise a first local oscillator output signal and a second local oscillator output signal; the injection signal generator module comprises a first transistor and a second transistor; an injection signal output of the plurality of injection signal outputs is coupled to a drain of the first transistor and to a drain of the second transistor; a source of the first transistor is coupled to the first VCO signal; and a source of the second transistor is coupled to the second VCO signal, and wherein a gate of the first transistor is coupled to the first local oscillator output signal when a division ratio of three is selected, to a supply voltage when a division ratio of four is selected, and to the first local oscillator output signal when a division ratio of five is selected; and a gate of the second transistor is coupled to the second local oscillator output signal when a division ratio of three is selected, to a circuit ground when a division ratio of four is selected, and to the second local oscillator output signal when a division ratio of five is selected.

28. A method of generating local oscillator signals, comprising:
generating, in a local oscillator generator module, the local oscillator signals based on received injection signals; and
generating, in an injection signal generator module, the injection signals based on the local oscillator signals and a received voltage controlled oscillator (VCO) signal,
wherein the injection signal generator module is programmable to concurrently provide at least three different sets of injection signals.

29. The method of claim 28, wherein the local oscillator generator module comprises n delay stages and n injection signal inputs, each of the n injection signal inputs being between a different pair of delay stages, each of the n injection signal inputs being independently controlled by the injection signal generator module.

30. The method of claim 28, wherein the local oscillator generator module comprises a plurality of delay stages, and the method further comprises tuning, in a tuning module coupled to the local oscillator generator module, a frequency of local oscillator signals.

31. The method of claim 30, further comprising adjusting, in the tuning module, a capacitance of each of the delay stages in order to tune the frequency of the local oscillator signals.

32. The method of claim 30, wherein the tuning comprises:
determining a frequency of the local oscillator signals;
comparing the determined frequency to a target frequency of the local oscillator signals; and
adjusting the frequency stepwise of the local oscillator signals until a difference between the frequency and the target frequency is less than a threshold.

33. The method of claim 28, further comprising:
selecting, in a division ratio selection module, a division ratio of a plurality of available division ratios; and
providing the selected division ratio to the injection signal generator module,
wherein the injection signals are generated based on the received selected division ratio.

34. The method of claim 33, wherein the division ratio is selected from one of at least three available division ratios.

35. The method of claim 34, wherein the at least three available division ratios include a division ratio of approximately 3, a division ratio of approximately 4, and division ratio of approximately 5.

36. The method of claim 34, further comprising:
dividing, in the injection signal generator module and the local oscillator generator module, a frequency of the received VCO signal by a division ratio approximately equal to 3, 4, or 5 based on input from the division ratio selection module; and
providing the local oscillator signals at each of the divided frequencies separately based on the input from the division ratio selection module.

37. The method of claim 28, further comprising providing, in a VCO module, the VCO signal to the injection signal generator module.

38. The method of claim 28, further comprising receiving, in the injection signal generator module, the VCO signal at a frequency approximately equal to three times a desired frequency of the local oscillator signals.

39. The method of claim 28, further comprising receiving, in the injection signal generator module, the VCO signal at a frequency approximately equal to four times a desired frequency of the local oscillator signals.

40. The method of claim 28, further comprising receiving, in the injection signal generator module, the VCO signal at a frequency approximately equal to five times a desired frequency of the local oscillator signals.

41. The method of claim 28, wherein the received VCO signal comprises a first VCO signal and a second VCO signal; the local oscillator generator module has a plurality local oscillator outputs; the injection signal generator module has a plurality of injection signal inputs; the local oscillator outputs comprise a first local oscillator output signal and a second local oscillator output signal; the injection signal generator module comprises a first transistor and a second transistor; an injection signal output of a plurality of injection signal outputs is coupled to a drain of the first transistor and to a drain of the second transistor; a source of the first transistor is coupled to the first VCO signal; and a source of the second transistor is coupled to the second VCO signal.

42. The method of claim 41, wherein a gate of the first transistor is coupled to the first local oscillator output signal when a division ratio of three is selected, to a circuit ground when a division ratio of four is selected, and to the second local oscillator output signal when a division ratio of five is selected; and a gate of the second transistor is coupled to the second local oscillator output signal when a division ratio of three is selected, to a supply voltage when a division ratio of four is selected, and to the first local oscillator output signal when a division ratio of five is selected.

43. The method of claim 41, wherein a gate of the first transistor is coupled to the second local oscillator output signal when a division ratio of three is selected, to a supply voltage when a division ratio of four is selected, and to the first local oscillator output signal when a division ratio of five is selected; and a gate of the second transistor is coupled to the first local oscillator output signal when a division ratio of three is selected, to a circuit ground when a division ratio of four is selected, and to the second local oscillator output signal when a division ratio of five is selected.

44. The method of claim 41, wherein a gate of the first transistor is coupled to the second local oscillator output signal when a division ratio of three is selected, to a circuit ground when a division ratio of four is selected, and to the second local oscillator output signal when a division ratio of five is selected; and a gate of the second transistor is coupled to the first local oscillator output signal when a division ratio of three is selected, to a supply voltage when a division ratio of four is selected, and to the first local oscillator output signal when a division ratio of five is selected.

45. A method of generating local oscillator signals, comprising:
  generating, in a local oscillator generator module, the local oscillator signals based on received injection signals;
  generating, in an injection signal generator module, the injection signals based on the local oscillator signals and a received voltage controlled oscillator (VCO) signal;
  receiving, in the injection signal generator module, the VCO signal at a frequency approximately equal to three times a desired frequency of the local oscillator signals; and
  providing, based on the received VCO signal and in the injection signal generator module, a first injection signal, a second injection signal, a third injection signal, and a fourth injection signal at a frequency approximately equal to the frequency of the VCO signal minus a frequency of the local oscillator signals, the first injection signal having a phase approximately equal to $\alpha$, the second injection signal having a phase approximately equal to $\alpha$, the third injection signal having a phase approximately equal to $\alpha+\pi$, and the fourth injection signal having a phase approximately equal to $\alpha+\pi$.

46. The method of claim 45, further comprising generating, based on the received injection signals and in the local oscillator generator module, the local oscillator signals at a frequency approximately equal to one half of the frequency of the injections signals.

47. The method of claim 45, wherein the local oscillator generator module comprises four delay stages coupled in series, the four delay stages comprising a first delay stage coupled in series between a second delay stage and a fourth delay stage, the second delay stage coupled in series between the first delay stage and a third delay stage, the third delay stage coupled in series between the second delay stage and the fourth delay stage, the fourth delay stage coupled in series between the third delay stage and the first delay stage, wherein the first injection signal is applied to a first injection signal input between the first delay stage and the second delay stage, the second injection signal is applied to a second injection signal input between the second delay stage and the third delay stage, the third injection signal is applied to a third injection signal input between the third delay stage and the fourth delay stage, and the fourth injection signal is applied to a fourth injection signal input between the fourth delay stage and the first delay stage.

48. A method of generating local oscillator signals, comprising:
  generating, in a local oscillator generator module, the local oscillator signals based on received injection signals;
  generating, in an injection signal generator module, the injection signals based on the local oscillator signals and a received voltage controlled oscillator (VCO) signal;
  receiving, in the injection signal generator module, the VCO signal at a frequency approximately equal to four times a desired frequency of the local oscillator signals; and
  providing, based on the received VCO signal and in the injection signal generator module, a first injection signal, a second injection signal, a third injection signal, and a fourth injection signal at a frequency approximately equal to the frequency of the VCO signal, the first injection signal having a phase approximately equal to $\alpha$, the second injection signal having a phase approximately equal to $\alpha+\pi$, the third injection signal having a phase approximately equal to $\alpha$, and the fourth injection signal having a phase approximately equal to $\alpha+\pi$.

49. The method of claim 48, further comprising generating, based on the received injection signals and in the local oscillator generator module, the local oscillator signals at a frequency approximately equal to one fourth of the frequency of the injections signals.

50. The method of claim 48, wherein the local oscillator generator module comprises four delay stages coupled in series, the four delay stages comprising a first delay stage coupled in series between a second delay stage and a fourth delay stage, the second delay stage coupled in series between the first delay stage and a third delay stage, the third delay stage coupled in series between the second delay stage and the fourth delay stage, the fourth delay stage coupled in series between the third delay stage and the first delay stage, wherein the first injection signal is applied to a first injection signal input between the first delay stage and the second delay stage, the second injection signal is applied to a second injection signal input between the second delay stage and the third delay stage, the third injection signal is applied to a third injection signal input between the third delay stage and the fourth delay stage, and the fourth injection signal is applied to a fourth injection signal input between the fourth delay stage and the first delay stage.

51. A method of generating local oscillator signals, comprising:
  generating, in a local oscillator generator module, the local oscillator signals based on received injection signals;
  generating, in an injection signal generator module, the injection signals based on the local oscillator signals and a received voltage controlled oscillator (VCO) signal;
  receiving, in the injection signal generator module, the VCO signal at a frequency approximately equal to five times a desired frequency of the local oscillator signals; and
  providing, based on the received VCO signal and in the injection signal generator module, a first injection signal, a second injection signal, a third injection signal, and a fourth injection signal at a frequency approximately equal to the frequency of the VCO signal minus a frequency of the local oscillator signals, the first injection signal having a phase approximately equal to $\alpha$, the second injection signal having a phase approximately equal to $\alpha+\pi$, the third injection signal having a phase approximately equal to $\alpha$, and the fourth injection signal having a phase approximately equal to $\alpha+\pi$.

52. The method of claim 51, further comprising generating, based on the received injection signals and in the local oscillator generator module, the local oscillator signals at a frequency approximately equal to one fourth of the frequency of the injections signals.

53. The method of claim 51, wherein the local oscillator generator module comprises four delay stages coupled in series, the four delay stages comprising a first delay stage coupled in series between a second delay stage and a fourth delay stage, the second delay stage coupled in series between the first delay stage and a third delay stage, the third delay stage coupled in series between the second delay stage and the fourth delay stage, the fourth delay stage coupled in series between the third delay stage and the first delay stage, wherein the first injection signal is applied to a first injection signal input between the first delay stage and the second delay stage, the second injection signal is applied to a second injection signal input between the second delay stage and the third delay stage, the third injection signal is applied to a third injection signal input between the third delay stage and the fourth delay stage, and the fourth injection signal is applied to a fourth injection signal input between the fourth delay stage and the first delay stage.

54. A method of generating local oscillator signals, comprising:
generating, in a local oscillator generator module, the local oscillator signals based on received injection signals;
generating, in an injection signal generator module, the injection signals based on the local oscillator signals and a received voltage controlled oscillator (VCO) signal,
wherein the received VCO signal comprises a first VCO signal and a second VCO signal; the local oscillator generator module has a plurality local oscillator outputs; the injection signal generator module has a plurality of injection signal inputs; the local oscillator outputs comprise a first local oscillator output signal and a second local oscillator output signal; the injection signal generator module comprises a first transistor and a second transistor; an injection signal output of a plurality of injection signal outputs is coupled to a drain of the first transistor and to a drain of the second transistor; a source of the first transistor is coupled to the first VCO signal; and a source of the second transistor is coupled to the second VCO signal, and
wherein a gate of the first transistor is coupled to the first local oscillator output signal when a division ratio of three is selected, to a supply voltage when a division ratio of four is selected, and to the first local oscillator output signal when a division ratio of five is selected; and a gate of the second transistor is coupled to the second local oscillator output signal when a division ratio of three is selected, to a circuit ground when a division ratio of four is selected, and to the second local oscillator output signal when a division ratio of five is selected.

55. An apparatus for generating local oscillator signals, comprising:
means for generating, in a local oscillator generator module, the local oscillator signals based on received injection signals; and
means for generating, in an injection signal generator module, the injection signals based on local oscillator signals and a received voltage controlled oscillator (VCO) signal,
wherein the injection signal generator module is programmable to concurrently provide at least three different sets of injection signals.

56. The apparatus of claim 55, wherein the local oscillator generator module comprises n delay stages and n injection signal inputs, each of the n injection signal inputs being between a different pair of delay stages, each of the n injection signal inputs being independently controlled by the injection signal generator module.

57. The apparatus of claim 55, wherein the local oscillator generator module comprises a plurality of delay stages, and the apparatus further comprises means for tuning, in a tuning module coupled to the local oscillator generator module, a frequency of the local oscillator signals.

58. The apparatus of claim 57, wherein the means for tuning is configured to:
determine a frequency of the local oscillator signals;
compare the determined frequency to a target frequency of local oscillator signals; and
adjust the frequency stepwise of the local oscillator signals until a difference between the frequency and the target frequency is less than a threshold.

59. The apparatus of claim 55, further comprising:
means for selecting, in a division ratio selection module, a division ratio of a plurality of available division ratios; and
means for providing the selected division ratio to the injection signal generator module,
wherein the injection signals are generated based on the received selected division ratio.

60. The apparatus of claim 55, further comprising means for providing, in a VCO module, the VCO signal to the injection signal generator module.

61. The apparatus of claim 55, further comprising means for receiving, in the injection signal generator module, the VCO signal at a frequency approximately equal to three times a desired frequency of the local oscillator signals.

62. The apparatus of claim 55, further comprising means for receiving, in the injection signal generator module, the VCO signal at a frequency approximately equal to four times a desired frequency local oscillator signals.

63. The apparatus of claim 55, further comprising means for receiving, in the injection signal generator module, the VCO signal at a frequency approximately equal to five times a desired frequency of the local oscillator signals.

64. The apparatus of claim 55, wherein the received VCO signal comprises a first VCO signal and a second VCO signal; the local oscillator generator module has a plurality of local oscillator outputs; the injection signal generator module has a plurality of injection signal inputs; local oscillator outputs comprise a first local oscillator output signal and a second local oscillator output signal; the injection signal generator module comprises a first transistor and a second transistor; an injection signal output of a plurality of injection signal outputs is coupled to a drain of the first transistor and to a drain of the second transistor; a source of the first transistor is coupled to the first VCO signal; and a source of the second transistor is coupled to the second VCO signal.

65. An apparatus for generating local oscillator signals, comprising:
means for generating, in a local oscillator generator module, the local oscillator signals based on at least three concurrently received injection signals;
means for generating, in an injection signal generator module, the injection signals based on local oscillator signals and a received voltage controlled oscillator (VCO) signal,
wherein the local oscillator generator module comprises a plurality of delay stages, and the apparatus further comprises means for tuning, in a tuning module coupled to the local oscillator generator module, a frequency of the local oscillator signals; and
means for adjusting, in the tuning module, a capacitance of each of the delay stages in order to tune the frequency of the local oscillator signals.

66. An apparatus for generating local oscillator signals, comprising:
means for generating, in a local oscillator generator module, the local oscillator signals based on at least three concurrently received injection signals;
means for generating, in an injection signal generator module, the injection signals based on local oscillator signals and a received voltage controlled oscillator (VCO) signal;
means for selecting, in a division ratio selection module, a division ratio of a plurality of available division ratios; and
means for providing the selected division ratio to the injection signal generator module, wherein the injection signals are generated based on the received selected division ratio, and
wherein the division ratio is selected from one of at least three available division ratios.

67. The apparatus of claim 66, wherein the at least three available division ratios include a division ratio of approximately 3, a division ratio of approximately 4, and division ratio of approximately 5.

68. The apparatus of claim 66, further comprising:
means for dividing, in the injection signal generator module and the local oscillator generator module, a frequency of the received VCO signal by a division ratio approximately equal to 3, 4, or 5 based on input from the division ratio selection module; and
means for providing the local oscillator signals at each of the divided frequencies separately based on the input from the division ratio selection module.

69. An apparatus for generating local oscillator signals, comprising:
means for generating, in a local oscillator generator module, the local oscillator signals based on received injection signals;
means for generating, in an injection signal generator module, the injection signals based on local oscillator signals and a received voltage controlled oscillator (VCO) signal;
means for receiving, in the injection signal generator module, the VCO signal at a frequency approximately equal to three times a desired frequency of the local oscillator signals; and
means for providing, based on the received VCO signal and in the injection signal generator module, a first injection signal, a second injection signal, a third injection signal, and a fourth injection signal at a frequency approximately equal to the frequency of the VCO signal minus a frequency of the local oscillator signals, the first injection signal having a phase approximately equal to $\alpha$, the second injection signal having a phase approximately equal to $\alpha$, the third injection signal having a phase approximately equal to $\alpha+\pi$, and the fourth injection signal having a phase approximately equal to $\alpha+\pi$.

70. The apparatus of claim 69, further comprising means for generating, based on the received injection signals and in the local oscillator generator module, the local oscillator signals at a frequency approximately equal to one half of the frequency of the injections signals.

71. The apparatus of claim 69, wherein the local oscillator generator module comprises four delay stages coupled in series, the four delay stages comprising a first delay stage coupled in series between a second delay stage and a fourth delay stage, the second delay stage coupled in series between the first delay stage and a third delay stage, the third delay stage coupled in series between the second delay stage and the fourth delay stage, the fourth delay stage coupled in series between the third delay stage and the first delay stage, wherein the first injection signal is applied to a first injection signal input between the first delay stage and the second delay stage, the second injection signal is applied to a second injection signal input between the second delay stage and the third delay stage, the third injection signal is applied to a third injection signal input between the third delay stage and the fourth delay stage, and the fourth injection signal is applied to a fourth injection signal input between the fourth delay stage and the first delay stage.

72. An apparatus for generating local oscillator signals, comprising:
means for generating, in a local oscillator generator module, the local oscillator signals based on received injection signals; and
means for generating, in an injection signal generator module, the injection signals based on local oscillator signals and a received voltage controlled oscillator (VCO) signal;
means for receiving, in the injection signal generator module, the VCO signal at a frequency approximately equal to four times a desired frequency local oscillator signals; and
means for providing, based on the received VCO signal and in the injection signal generator module, a first injection signal, a second injection signal, a third injection signal, and a fourth injection signal at a frequency approximately equal to the frequency of the VCO signal, the first injection signal having a phase approximately equal to $\alpha$, the second injection signal having a phase approximately equal to $\alpha+\pi$, the third injection signal having a phase approximately equal to $\alpha$, and the fourth injection signal having a phase approximately equal to $\alpha+\pi$.

73. The apparatus of claim 72, further comprising means for generating, based on the received injection signals and in the local oscillator generator module, the local oscillator signals at a frequency approximately equal to one fourth of the frequency of the injections signals.

74. The apparatus of claim 72, wherein the local oscillator generator module comprises four delay stages coupled in series, the four delay stages comprising a first delay stage coupled in series between a second delay stage and a fourth delay stage, the second delay stage coupled in series between the first delay stage and a third delay stage, the third delay stage coupled in series between the second delay stage and the fourth delay stage, the fourth delay stage coupled in series between the third delay stage and the first delay stage, wherein the first injection signal is applied to a first injection signal input between the first delay stage and the second delay stage, the second injection signal is applied to a second injection signal input between the second delay stage and the third delay stage, the third injection signal is applied to a third injection signal input between the third delay stage and the fourth delay stage, and the fourth injection signal is applied to a fourth injection signal input between the fourth delay stage and the first delay stage.

75. An apparatus for generating local oscillator signals, comprising:
means for generating, in a local oscillator generator module, the local oscillator signals based on received injection signals; and
means for generating, in an injection signal generator module, the injection signals based on local oscillator signals and a received voltage controlled oscillator (VCO) signal;
means for receiving, in the injection signal generator module, the VCO signal at a frequency approximately equal to five times a desired frequency of the local oscillator signals; and
means for providing, based on the received VCO signal and in the injection signal generator module, a first injection signal, a second injection signal, a third injection signal, and a fourth injection signal at a frequency approximately equal to the frequency of the VCO signal minus a frequency of the local oscillator signals, the first injection signal having a phase approximately equal to $\alpha$, the second injection signal having a phase approximately equal to α+π, the third injection signal having a phase approximately equal to α, and the fourth injection signal having a phase approximately equal to α+π.

76. The apparatus of claim 75, further comprising means for generating, based on the received injection signals and in the local oscillator generator module, the local oscillator signals at a frequency approximately equal to one fourth of the frequency of the injections signals.

77. The apparatus of claim 75, wherein the local oscillator generator module comprises four delay stages coupled in series, the four delay stages comprising a first delay stage coupled in series between a second delay stage and a fourth delay stage, the second delay stage coupled in series between the first delay stage and a third delay stage, the third delay stage coupled in series between the second delay stage and the fourth delay stage, the fourth delay stage coupled in series between the third delay stage and the first delay stage, wherein the first injection signal is applied to a first injection signal input between the first delay stage and the second delay stage, the second injection signal is applied to a second injection signal input between the second delay stage and the third delay stage, the third injection signal is applied to a third injection signal input between the third delay stage and the fourth delay stage, and the fourth injection signal is applied to a fourth injection signal input between the fourth delay stage and the first delay stage.

78. An apparatus for generating local oscillator signals, comprising:
  means for generating, in a local oscillator generator module, the local oscillator signals based on received injection signals; and
  means for generating, in an injection signal generator module, the injection signals based on local oscillator signals and a received voltage controlled oscillator (VCO) signal,
  wherein the received VCO signal comprises a first VCO signal and a second VCO signal; the local oscillator generator module has a plurality of local oscillator outputs; the injection signal generator module has a plurality of injection signal inputs; local oscillator outputs comprise a first local oscillator output signal and a second local oscillator output signal; the injection signal generator module comprises a first transistor and a second transistor; an injection signal output of a plurality of injection signal outputs is coupled to a drain of the first transistor and to a drain of the second transistor; a source of the first transistor is coupled to the first VCO signal; and a source of the second transistor is coupled to the second VCO signal, and
  wherein a gate of the first transistor is coupled to the first local oscillator output signal when a division ratio of three is selected, to a supply voltage when a division ratio of four is selected, and to the first local oscillator output signal when a division ratio of five is selected; and a gate of the second transistor is coupled to the second local oscillator output signal when a division ratio of three is selected, to a circuit ground when a division ratio of four is selected, and to the second local oscillator output signal when a division ratio of five is selected.

79. An apparatus for generating local oscillator signals, comprising:
  means for generating, in a local oscillator generator module, the local oscillator signals based on received injection signals; and
  means for generating, in an injection signal generator module, the injection signals based on local oscillator signals and a received voltage controlled oscillator (VCO) signal,
  wherein the received VCO signal comprises a first VCO signal and a second VCO signal; the local oscillator generator module has a plurality of local oscillator outputs; the injection signal generator module has a plurality of injection signal inputs; local oscillator outputs comprise a first local oscillator output signal and a second local oscillator output signal; the injection signal generator module comprises a first transistor and a second transistor; an injection signal output of a plurality of injection signal outputs is coupled to a drain of the first transistor and to a drain of the second transistor; a source of the first transistor is coupled to the first VCO signal; and a source of the second transistor is coupled to the second VCO signal, and
  wherein a gate of the first transistor is coupled to the first local oscillator output signal when a division ratio of three is selected, to a circuit ground when a division ratio of four is selected, and to the second local oscillator output signal when a division ratio of five is selected; and a gate of the second transistor is coupled to the second local oscillator output signal when a division ratio of three is selected, to a supply voltage when a division ratio of four is selected, and to the first local oscillator output signal when a division ratio of five is selected.

80. An apparatus for generating local oscillator signals, comprising:
  means for generating, in a local oscillator generator module, the local oscillator signals based on received injection signals; and
  means for generating, in an injection signal generator module, the injection signals based on local oscillator signals and a received voltage controlled oscillator (VCO) signal,
  wherein the received VCO signal comprises a first VCO signal and a second VCO signal; the local oscillator generator module has a plurality of local oscillator outputs; the injection signal generator module has a plurality of injection signal inputs; local oscillator outputs comprise a first local oscillator output signal and a second local oscillator output signal; the injection signal generator module comprises a first transistor and a second transistor; an injection signal output of a plurality of injection signal outputs is coupled to a drain of the first transistor and to a drain of the second transistor; a source of the first transistor is coupled to the first VCO signal; and a source of the second transistor is coupled to the second VCO signal, and
  wherein a gate of the first transistor is coupled to the second local oscillator output signal when a division ratio of three is selected, to a supply voltage when a division ratio of four is selected, and to the first local oscillator output signal when a division ratio of five is selected; and a gate of the second transistor is coupled to the first local oscillator output signal when a division ratio of three is selected, to a circuit ground when a division ratio of four is selected, and to the second local oscillator output signal when a division ratio of five is selected.

81. An apparatus for generating local oscillator signals, comprising:
  means for generating, in a local oscillator generator module, the local oscillator signals based on received injection signals; and means for generating, in an injection signal generator module, the injection signals based on local oscillator signals and a received voltage controlled oscillator (VCO) signal, wherein the received VCO signal comprises a first VCO signal and a second VCO signal; the local oscillator generator module has a plurality of local oscillator outputs; the injection signal generator module has a plurality of injection signal inputs; local oscillator outputs comprise a first local oscillator output signal and a second local oscillator output signal; the injection signal generator module comprises a first transistor and a second transistor; an injection signal output of the plurality of injection signal outputs is coupled to a drain of the first transistor and to a drain of a second transistor; a source of the first transistor is coupled to the first VCO signal; and a source of the second transistor is coupled to the second VCO signal, and wherein a gate of the first transistor is coupled to the second local oscillator output signal when a division ratio of three is selected, to a circuit ground when a division ratio of four is selected, and to the second local oscillator output signal when a division ratio of five is selected; and a gate of the second transistor is coupled to the local oscillator output signal when a division ratio of three is selected, to a supply voltage when a division ratio of four is selected, and to the first local oscillator output signal when a division ratio of five is selected.

\* \* \* \* \*